(12) United States Patent
Lin et al.

(10) Patent No.: US 11,004,816 B2
(45) Date of Patent: May 11, 2021

(54) HETERO-INTEGRATED STRUCTURE

(71) Applicant: Industrial Technology Research Institute, Hsinchu (TW)

(72) Inventors: Yu-Min Lin, Hsinchu County (TW); Ang-Ying Lin, Tainan (TW); Sheng-Tsai Wu, Taoyuan (TW); Tao-Chih Chang, Taoyuan (TW); Wei-Chung Lo, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/553,179

(22) Filed: Aug. 28, 2019

(65) Prior Publication Data

US 2020/0075519 A1 Mar. 5, 2020

Related U.S. Application Data

(60) Provisional application No. 62/723,499, filed on Aug. 28, 2018.

(51) Int. Cl.
*H01L 23/544* (2006.01)
*H01L 23/00* (2006.01)
(Continued)

(52) U.S. Cl.
CPC .............. *H01L 24/05* (2013.01); *H01L 21/78* (2013.01); *H01L 23/3157* (2013.01);
(Continued)

(58) Field of Classification Search
CPC ..... H01L 25/62; H01L 23/3157; H01L 24/32; H01L 23/83
See application file for complete search history.

(56) References Cited

U.S. PATENT DOCUMENTS 5,260,234 A 11/1993 Long
8,822,309 B2 9/2014 Pan
(Continued)

FOREIGN PATENT DOCUMENTS

CN 102244047 11/2011
CN 105575913 5/2016
(Continued)

OTHER PUBLICATIONS

"Office Action of Taiwan Counterpart Application", dated Feb. 11, 2020, p. 1-p. 4.
(Continued)

*Primary Examiner* — Phuc T Dang
(74) *Attorney, Agent, or Firm* — JCIPRNET

(57) ABSTRACT

A hetero-integrated structure includes a substrate, a die, a passivation layer, a first redistribution layer, a second redistribution layer, and connecting portions. The die is attached on the substrate. The die has an active surface and a non-active surface. The active surface has pads. The passivation layer covers sidewalls and a surface of the die to expose a surface of the pads. The first redistribution layer is located on the passivation layer and electrically connected to the pads. The second redistribution layer is located on the substrate and adjacent to the die. The connecting portions are connected to the first redistribution layer and the second redistribution layer.

19 Claims, 33 Drawing Sheets

(51) Int. Cl.
*H01L 21/78* (2006.01)
*H01L 23/31* (2006.01)

(52) U.S. Cl.
CPC .............. *H01L 24/32* (2013.01); *H01L 24/83* (2013.01); *H01L 2224/02205* (2013.01); *H01L 2224/02373* (2013.01); *H01L 2224/02375* (2013.01); *H01L 2224/02377* (2013.01); *H01L 2224/02381* (2013.01); *H01L 2224/32225* (2013.01); *H01L 2224/83951* (2013.01); *H01L 2924/10156* (2013.01); *H01L 2924/15153* (2013.01)

(56) References Cited

U.S. PATENT DOCUMENTS

| | | | | |
|---|---|---|---|---|
| 9,355,975 | B2* | 5/2016 | Ho | H01L 21/561 |
| 2008/0073795 | A1 | 3/2008 | Kohl et al. | |
| 2010/0044870 | A1 | 2/2010 | Yamaji et al. | |
| 2011/0278724 | A1* | 11/2011 | Lin | H01L 23/525 |
| | | | | 257/738 |
| 2014/0048766 | A1* | 2/2014 | Chu | H01L 33/505 |
| | | | | 257/13 |
| 2014/0367851 | A1* | 12/2014 | Lee | H01L 24/82 |
| | | | | 257/737 |
| 2017/0012011 | A1* | 1/2017 | Peng | H01L 23/53238 |
| 2018/0068921 | A1* | 3/2018 | Wang | H01L 24/24 |
| 2020/0006169 | A1* | 1/2020 | Warren | H01L 23/16 |

FOREIGN PATENT DOCUMENTS

| | | |
|---|---|---|
| CN | 107768258 | 3/2018 |
| CN | 107799450 | 3/2018 |
| CN | 108321123 | 7/2018 |
| TW | I509659 | 11/2015 |
| TW | 201620088 | 6/2016 |
| TW | 201816902 | 5/2018 |

OTHER PUBLICATIONS

"Office Action of China Counterpart Application", dated Nov. 26, 2020, p. 1-p. 11.

* cited by examiner

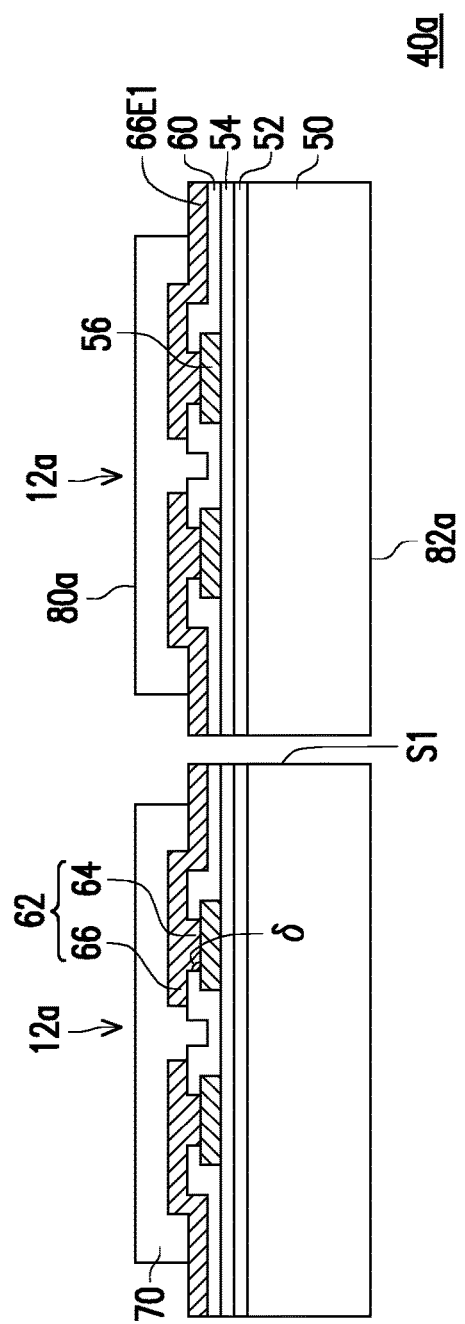
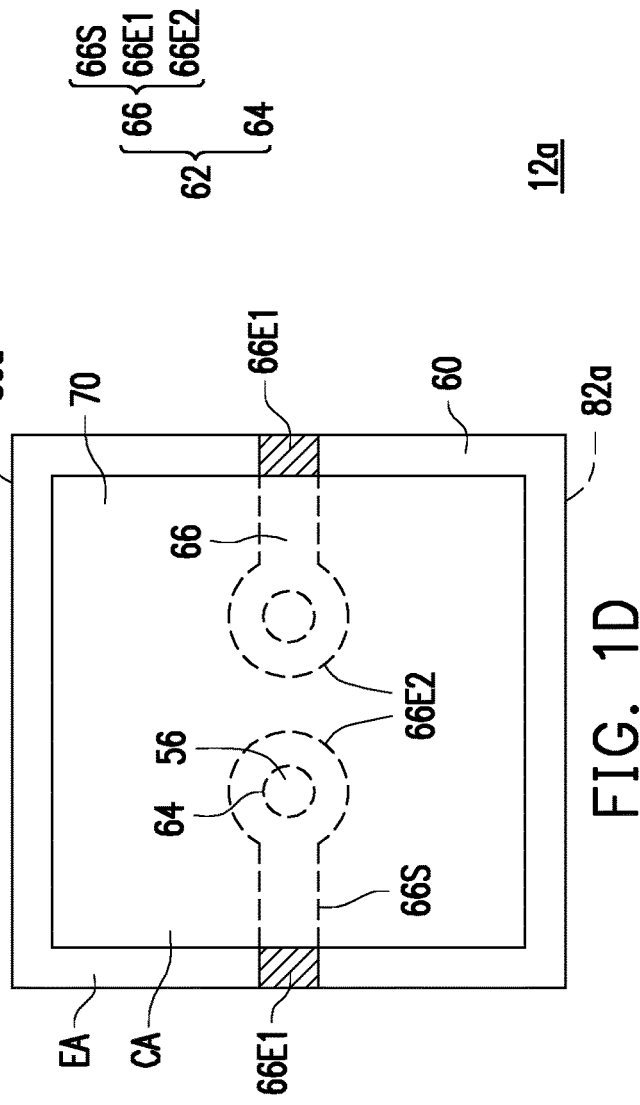
FIG. 1C
FIG. 1D

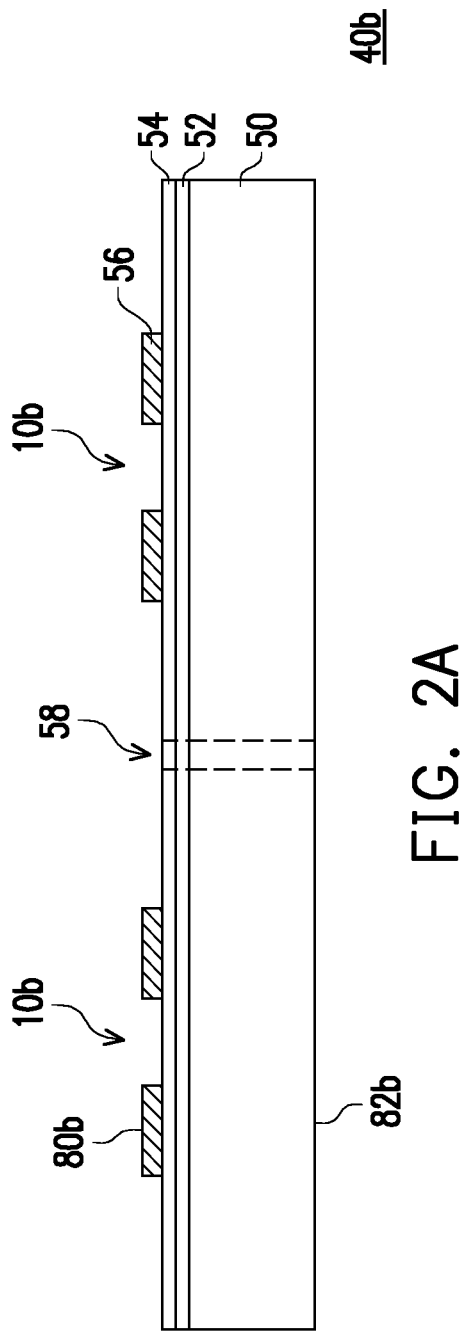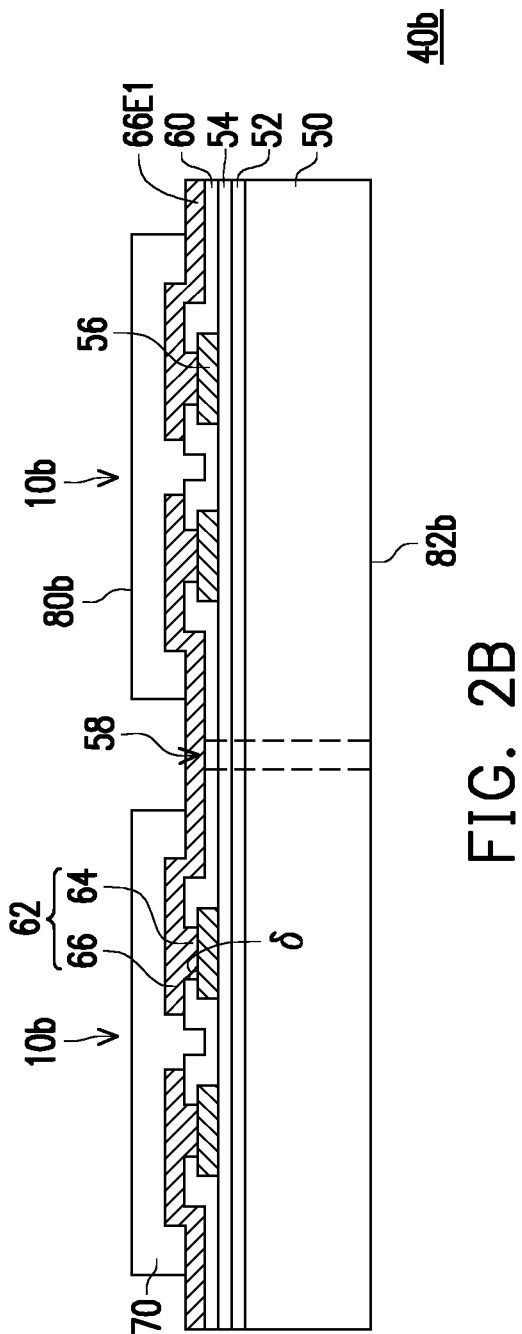

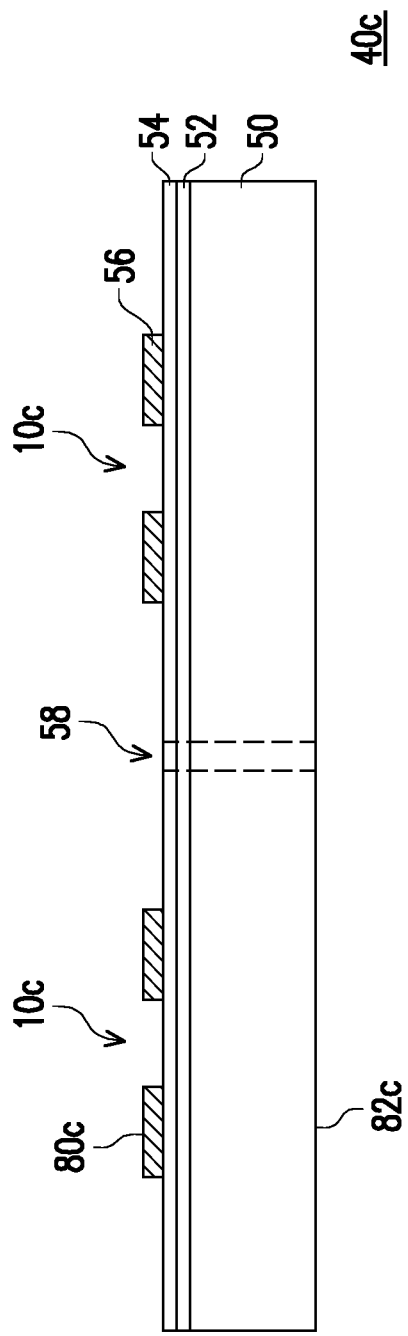
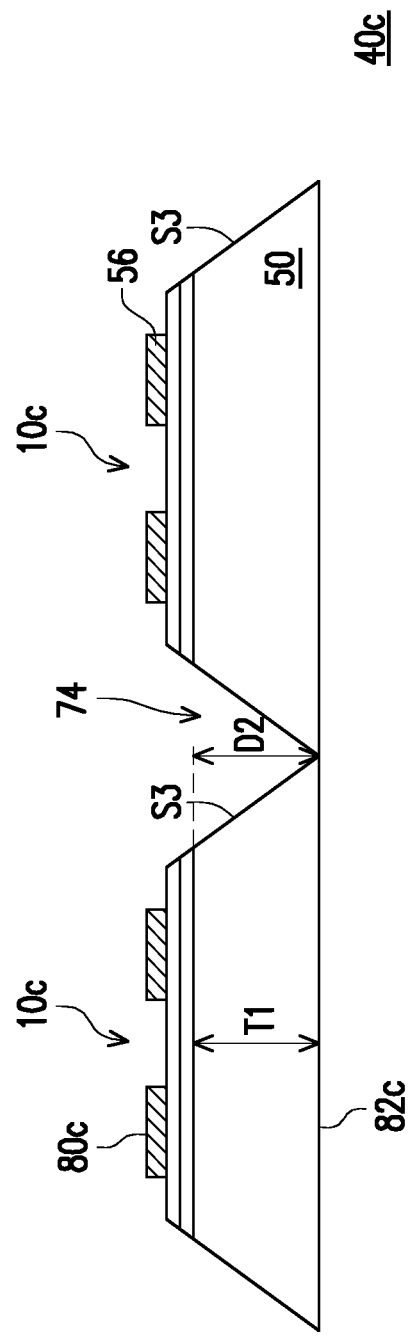
FIG. 3A
FIG. 3B

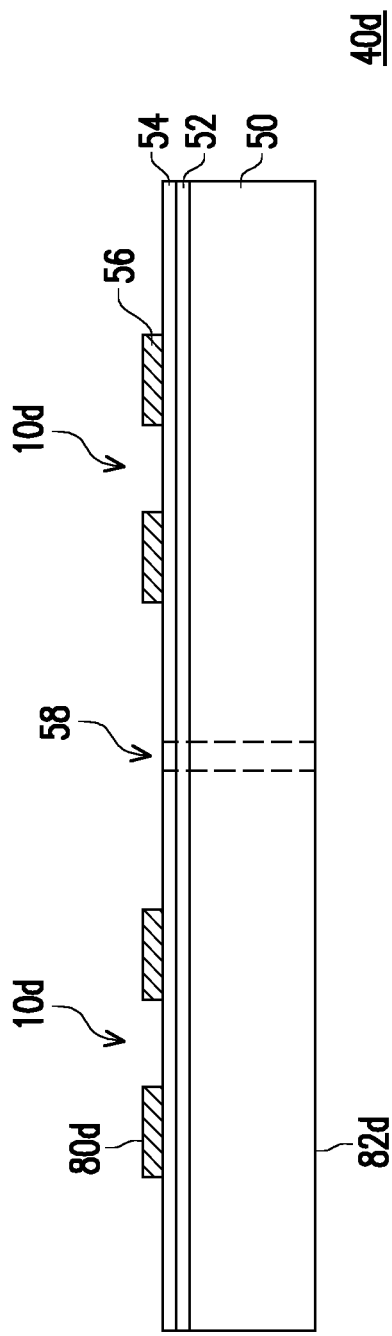
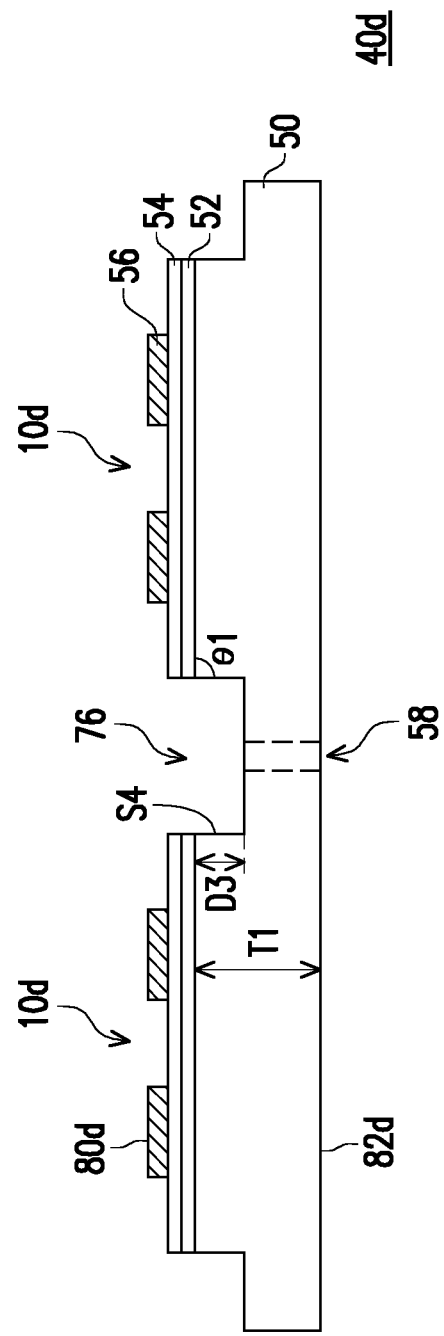
FIG. 4A
FIG. 4B

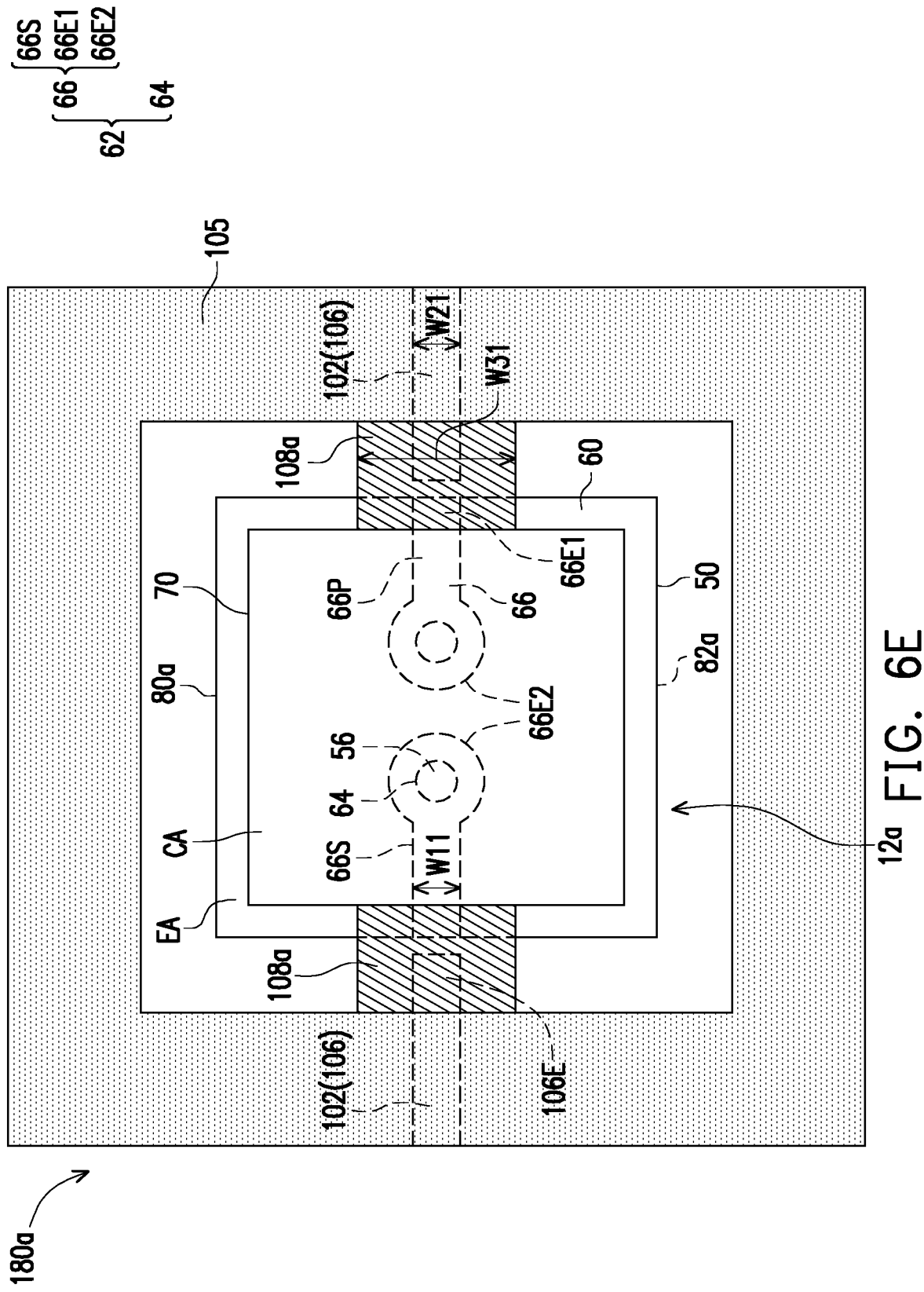

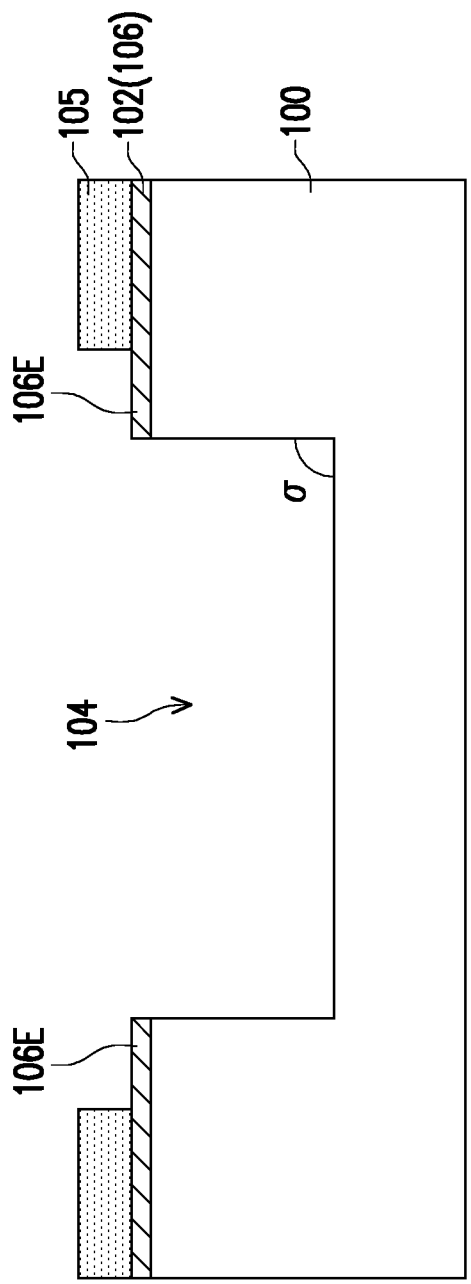
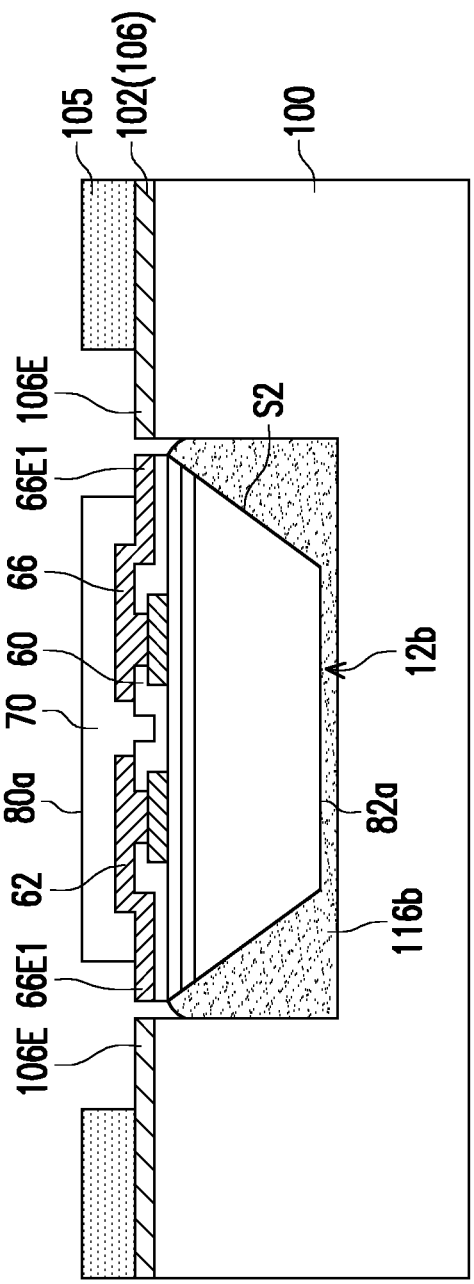
FIG. 7A
FIG. 7B

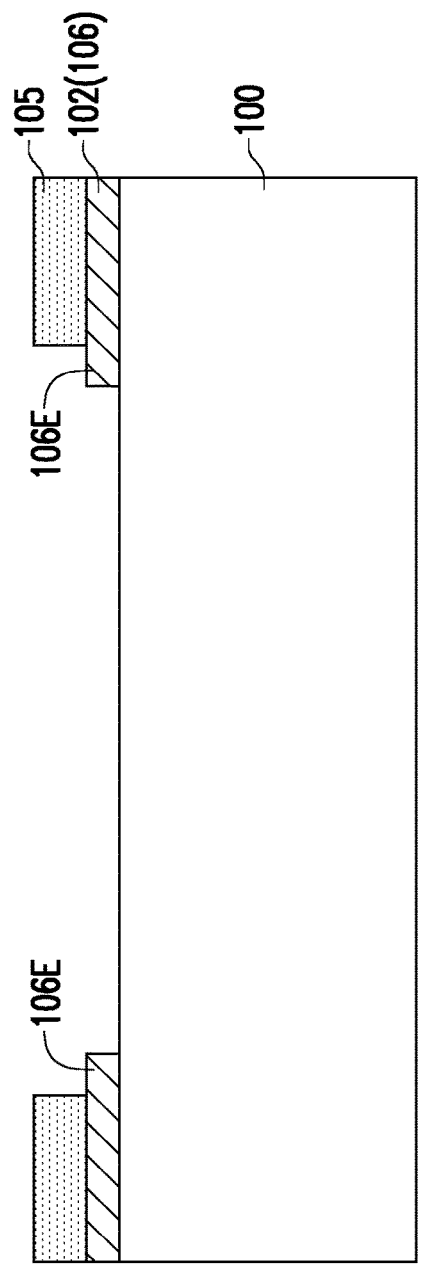
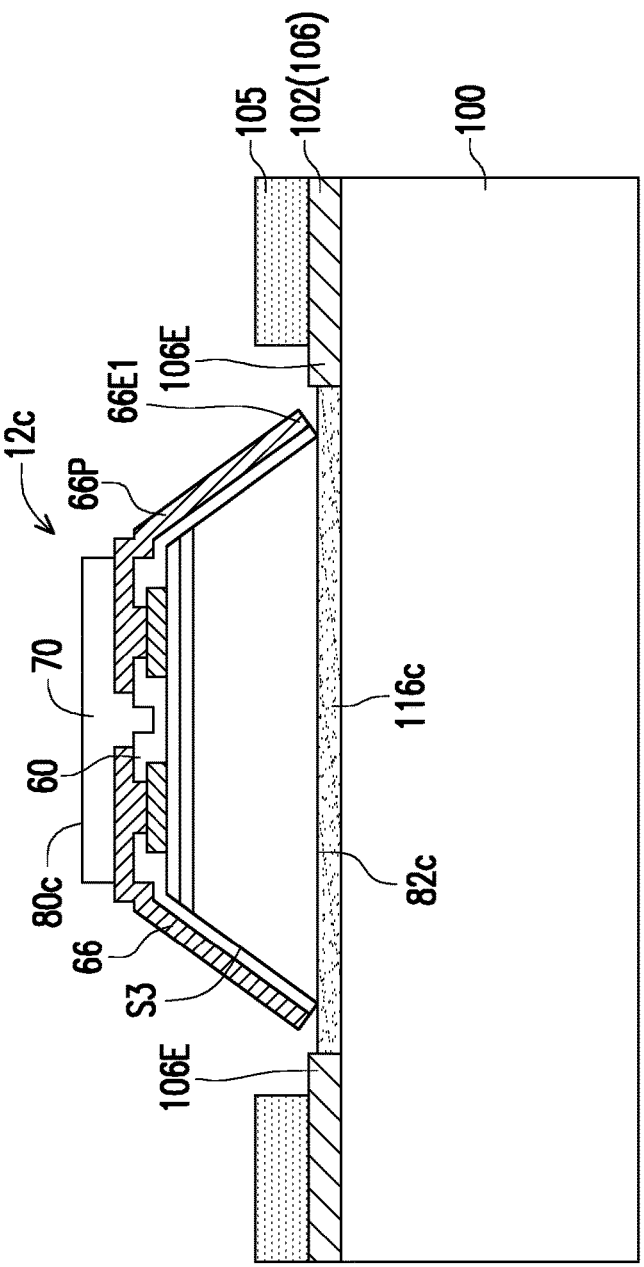
FIG. 8A
FIG. 8B

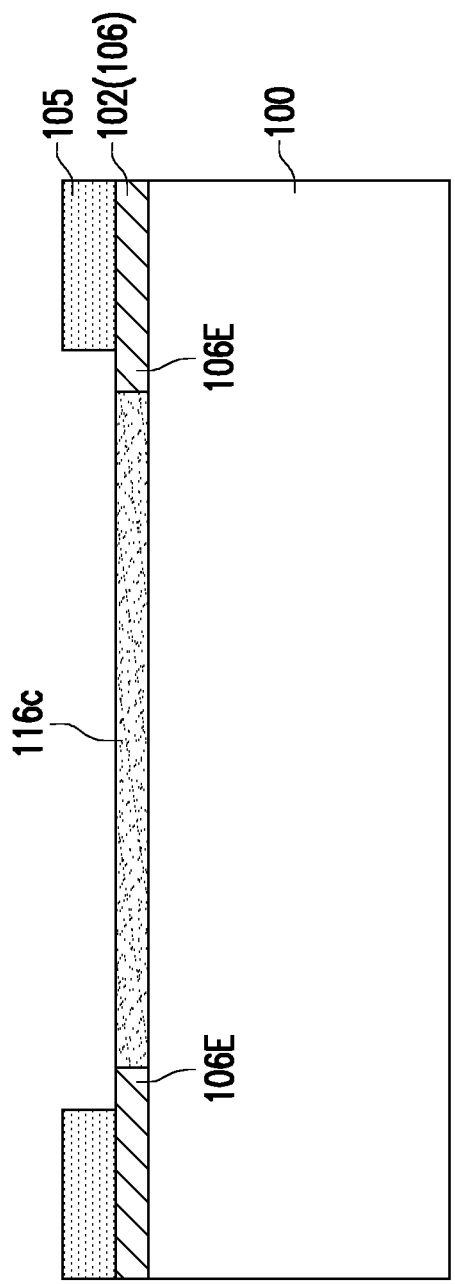
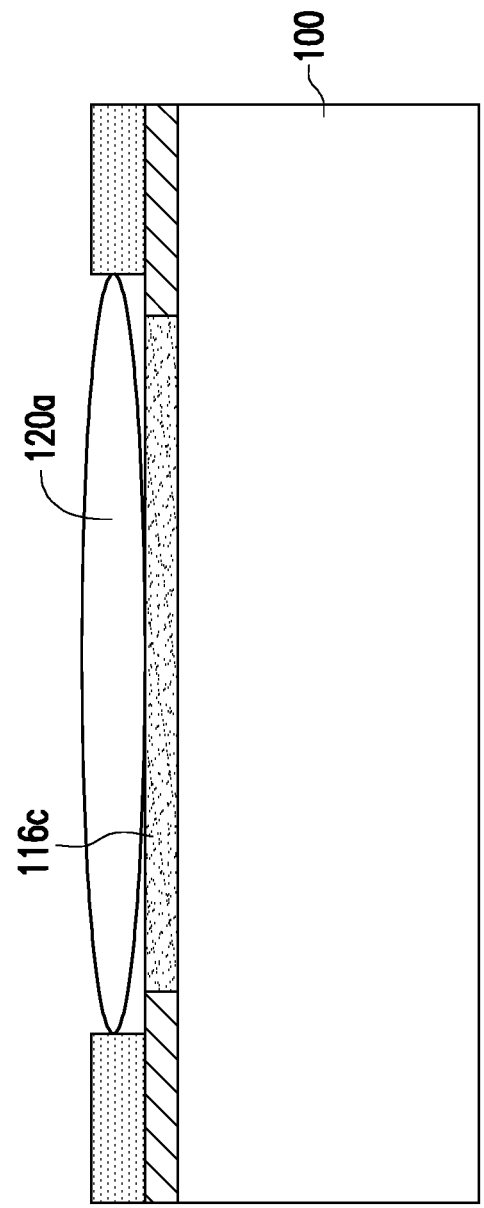
FIG. 9A
FIG. 9B

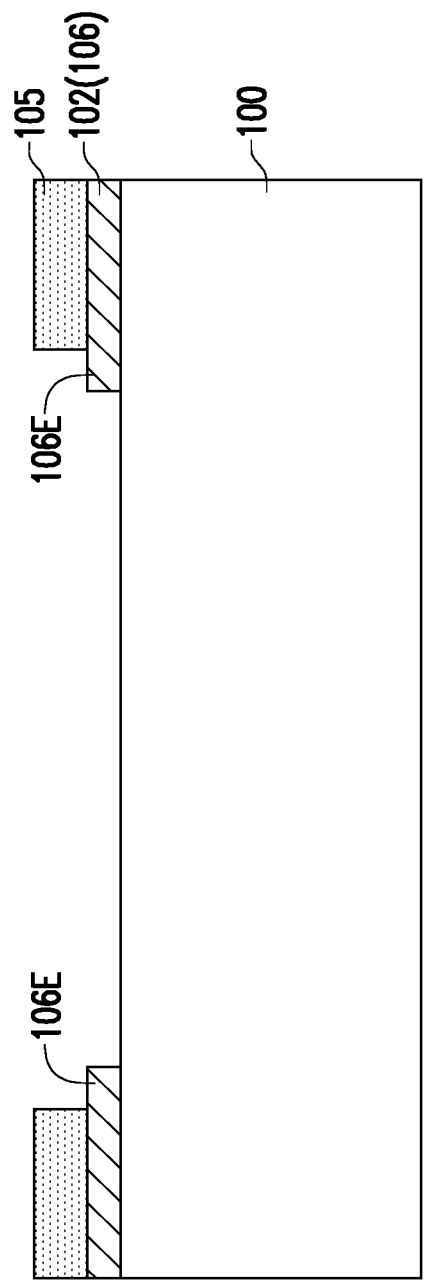
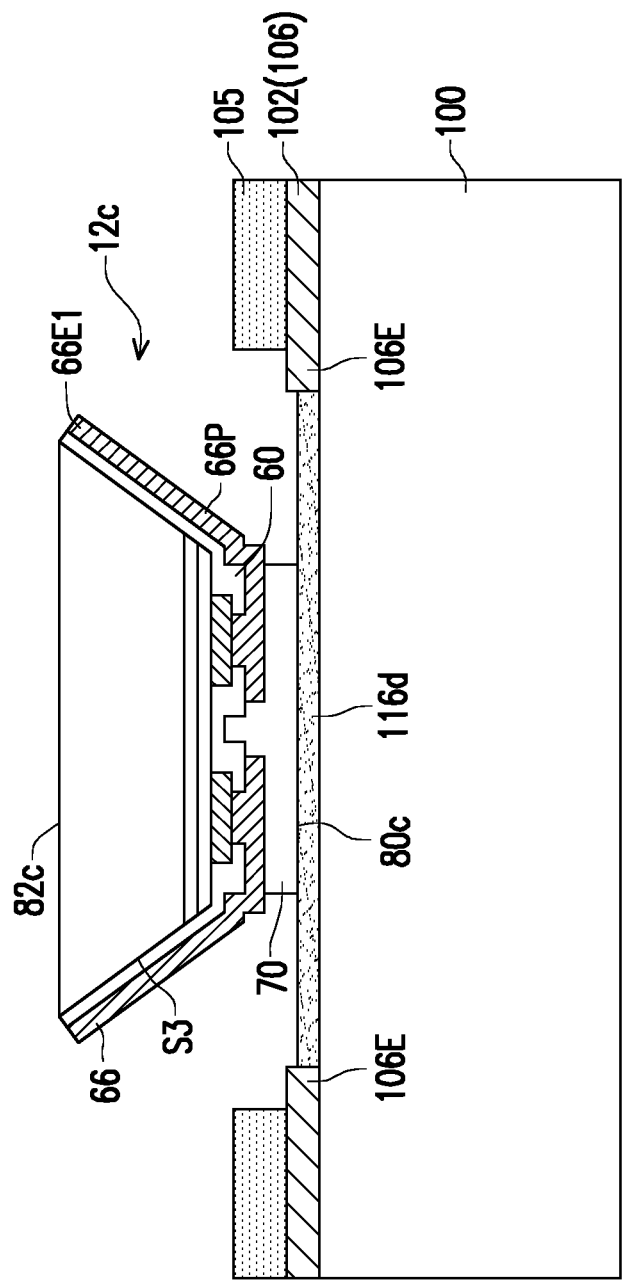

US 11,004,816 B2

HETERO-INTEGRATED STRUCTURE

CROSS-REFERENCE TO RELATED APPLICATION

This application claims the priority benefit of U.S. provisional application Ser. No. 62/723,499, filed on Aug. 28, 2018. The entirety of the above-mentioned patent application is hereby incorporated by reference herein and made a part of this specification.

TECHNICAL FIELD

The disclosure relates to a hetero-integrated structure and a method of fabricating the same.

BACKGROUND

With the thinning of electronic devices, the current trend is to directly connect hetero-semiconductor components to reduce the use of intermediate substrates, so that the size of semiconductor packages may be reduced while shortening electrical path, thus improving the operating speed in the semiconductor packages. The traditional hetero-assembly method is to solder at high temperatures, but high temperatures affect the performance of the chips. In response to more advanced requirements and to prevent the high temperature of conventional solder connections from affecting chip performance, novel assembly methods are always needed.

SUMMARY

The disclosure provides a hetero-integrated structure including a substrate, a die, a passivation layer, a first redistribution layer, a second redistribution layer, and connecting portions. The die is attached on the substrate. The die has an active surface and a non-active surface. The active surface has pads. The passivation layer covers sidewalls and a surface of the die to expose a surface of the pads. The first redistribution layer is located on the passivation layer and electrically connected to the pads. The second redistribution layer is located on the substrate and adjacent to the die. The connecting portions are connected to the first redistribution layer and the second redistribution layer.

The disclosure also provides a method of fabricating a hetero-integrated structure including the following steps. A wafer is provided, wherein the wafer includes a plurality of dies, each of the dies has an active surface and a non-active surface, and the active surface has pads. Notches are formed between the dies, wherein the recesses expose first sidewalls of the dies. A passivation layer is formed on the wafer to cover a surface of the dies to expose a surface of the pads. A first redistribution layer is formed on the passivation layer, wherein the first redistribution layer is electrically connected to the pads. A dicing process is performed to separate the dies on the wafer from each other. The dies are attached on a substrate, wherein the substrate has a second redistribution layer thereon. Connecting portions are formed, wherein the connecting portions are connected to the first redistribution layer and the second redistribution layer.

Based on the above, the method of an embodiment of the disclosure may include bonding in a low-temperature manner. Furthermore, in the disclosure, a wafer-level or panel-level process is adopted for attaching a plurality of dies. In addition, the use of an adhesive layer in liquid state or a droplet may achieve the effect of self-aligned assembly during attaching.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 1A to 1C are schematic cross-sectional views of a fabrication process of first dies according to an embodiment of the disclosure.

FIG. 1D is a top view of FIG. 1C.

FIGS. 2A to 2D are schematic cross-sectional views of a fabrication process of second dies according to an embodiment of the disclosure.

FIGS. 3A to 3D are schematic cross-sectional views of a fabrication process of third dies according to an embodiment of the disclosure.

FIGS. 4A to 4D are schematic cross-sectional views of a fabrication process of fourth dies according to an embodiment of the disclosure.

FIG. 6E is a top view of FIG. 6D.

FIGS. 7A to 7C are schematic cross-sectional views of a fabrication process of a hetero-integrated structure according to the second embodiment of the disclosure.

FIGS. 8A to 8C are schematic cross-sectional views of a fabrication process of a hetero-integrated structure according to the third embodiment of the disclosure.

FIGS. 9A to 9D are schematic cross-sectional views of a fabrication process of a hetero-integrated structure according to an embodiment of the disclosure.

FIGS. 10A to 10C are schematic cross-sectional views of a fabrication process of a hetero-integrated structure according to the fourth embodiment of the disclosure.

DETAILED DESCRIPTION OF DISCLOSED EMBODIMENTS

Fabrication of First Dies

Figure 1A:
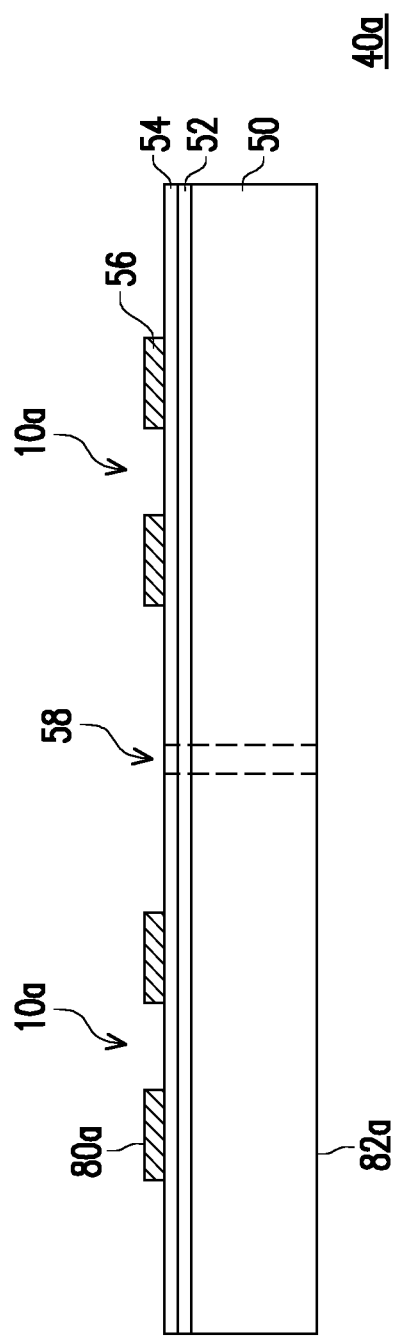

Referring to FIG. 1A, a wafer 40a is provided. The wafer 40a includes a plurality of chips 10a connected to each other. The chips 10a may respectively be memory chips, logic chips, digital chips, analog chips, sensor chips, wireless and radio frequency chips, light-emitting diodes (LED), microelectromechanical systems (MEMS), or voltage regulator chips, etc. The sensor chips may be image sensor chips or pressure sensors or air particle sensors, etc., and at least include charge-coupled devices (CCD) or complementary CMOS image sensors. The chips 10a may be the same type of chips or different types of chips. The chips 10a may be separated along a scribe line 58 by a wafer dicing process.

In some embodiments, the wafer 40a may include a substrate 50, a device layer 52, a metallization structure 54, and a plurality of pads 56. The metallization structure 54 includes a dielectric layer and a metal interconnect structure (not shown) located in the dielectric layer. In other words, the chips 10a respectively include a substrate 50, a device layer 52, a metallization structure 54, and a plurality of pads 56. The pads 56 are electrically connected to the devices located in the device layer 52 via the metal interconnect structure of the metallization structure 54.

The substrate 50 is a semiconductor substrate such as a silicon substrate. For example, the substrate 50 is a bulk silicon substrate, a doped silicon substrate, an undoped silicon substrate, or a silicon-on-insulator (SOI) substrate. The dopant of the doped silicon substrate may be a P-type dopant, an N-type dopant, or a combination of an N-type dopant and a P-type dopant. The substrate 50 may also be formed from other semiconductor materials. The other semiconductor materials include silicon-germanium, silicon carbide, gallium arsenide or the like, but are not limited thereto. Active regions and isolation structures (not shown) may also be included in the substrate 40.

The device layer 52 includes various devices (not shown) formed on the active regions of the substrate 40. In some embodiments, the devices include active devices, passive devices, or a combination of active devices and passive devices. In some embodiments, for example, the devices include integrated circuit devices. In some embodiments, the devices are, for example, transistors, diodes, photodiodes, capacitors, resistors, fuse devices, or other similar devices. That is, the wafer 40a is a wafer on which devices are formed and not a carrier. The metallization structure 54 is formed on the substrate 50 and the device layer 52. In some embodiments, the metallization structure 54 includes a plurality of dielectric layers and a metal interconnect structure formed in the plurality of dielectric layers. The metal interconnect structure is electrically connected to the devices in the device layer 52 and includes a plurality of metal lines and a plurality of plugs.

The pads 56 are formed on the metallization structure 54 and electrically connected to the metal interconnect structure in the metallization structure 54 to provide external connection to the devices in the device layer 52. The material of the pads 56 may include a metal or a metal alloy such as nickel (Ni), tin (Sn), palladium (Pd), vanadium (V), cobalt (Co), gold (Au), copper (Cu), silver (Ag), aluminum (Al), or a multilayer structure composed of these metals, an alloy thereof, a composite material thereof, or the like, but is not limited thereto. The top surface of the pads 56 and the top surface of the metallization structure 54 form an active surface 80a of the wafer 40a. In some embodiments, the active surface 80a is referred to as a first surface (or referred to as a front surface) of the wafer 40a, and a second surface (or referred to as a back surface) of the wafer 40a (i.e., a bottom surface) is opposite to the first surface, and is also referred to as a non-active surface 82a.

Figure 1B:
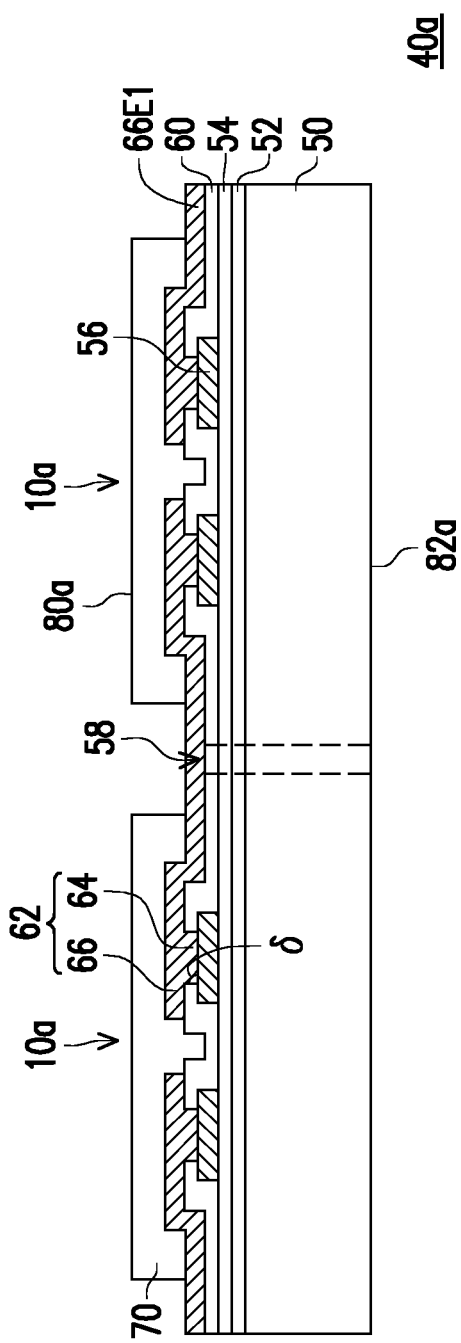

Referring to FIG. 1B, a passivation layer 60 having top via holes is formed on the wafer 40a. The top via holes expose a portion of the surface of the pads 56. The passivation layer 60 covers the surface of the metallization structure 54 and the surface of another portion of the pads 56. The passivation layer 60 may be a single-layer structure or a multi-layer structure. The passivation layer 60 contains an insulating material such as silicon oxide, silicon nitride, a polymer, or a combination thereof. The polymer is, for example, polybenzoxazole (PBO), polyimide (PI), benzocyclobutene (BCB), epoxy resin, a combination thereof, or the like.

Referring further to FIG. 1B, a first redistribution layer 62 is formed on the passivation layer 60. The first redistribution layer 62 may also be referred to as a first circuit layer. The first redistribution layer 62 is electrically connected to the pads 56. The first redistribution layer 62 includes a plurality of vias 64 and a plurality of first traces 66 connected to each other. The vias 64 are extended longitudinally through the passivation layer 60 to be connected to the pads 56. The first traces 66 are respectively located on the passivation layer 60 and extended horizontally on the top surface of the passivation layer 60, respectively. In some embodiments, the cross-sectional shape of the vias 64 is a square, a rectangle, or an inverted trapezoid. In some embodiments, a bottom angle δ of the vias 64 is an obtuse or right angle.

The material of the first redistribution layer 62 includes a metal such as copper, nickel, titanium, aluminum, palladium, gold, a combination thereof, or the like. The first redistribution layer 62 may be formed by an electroplating or electroless plating process. In some embodiments, the first redistribution layer 62 includes a seed layer (not shown) and a metal layer (not shown) formed thereon. The seed layer may be a metal seed layer, such as a copper seed layer. In some embodiments, the seed layer includes a first metal layer (e.g., a titanium layer) and a second metal layer (e.g., a copper layer on the first metal layer). The metal layer on the seed layer may be copper or other suitable metals.

Referring further to FIG. 1B, a plurality of protective layers 70 are formed on the wafer 40a. The protective layers 70 cover the passivation layer 60 and the first redistribution layer 62 located in the central region of the chips 10a. The protective layers 70 expose the passivation layer 60 of the edge region of each of the chips 10a and ends (first ends) 66E1 of the first traces 66. The material of the protective layers 70 is different from the material of the passivation layer 60. The protective layers 70 may be a single-layer structure or a multilayer structure. The protective layers 70 may be an insulating material. The protective layers 70s may be an inorganic material or an organic material such as silicon oxide, silicon nitride, polymer, or a combination thereof. The polymer is, for example, polybenzoxazole (PBO), polyimide (PI), benzocyclobutene (BCB), a combination thereof, or the like.

Referring to FIG. 1C and FIG. 1D, a dicing process of the wafer 40a is performed to separate the plurality of chips 10a from each other along the scribe line 58 to form a plurality of first dies 12a.

A central region CA of the active surface 80a of the first dies 12a is covered by the protective layers 70. An edge region EA of the active surface 80a of the first dies 12a is not covered by the protective layers 70, and the ends of the first redistribution layer 62 are exposed. In other words, the first redistribution layer 62 is located in a portion in the central region CA, that is, ends (second ends) 66E2 of the first traces 66 connected to the pads 56 and main body portions 66S of the first traces 66 are covered by the protective layers 70. The first redistribution layer 62 is located in another portion of the edge region EA, that is, the ends (first ends) 66E1 of the first traces 66 are not covered by the protective layers 70 and are exposed.

The first dies 12a have vertical sidewalls S1 that are exposed. In other words, the ends 66E1 of the first traces 66, the passivation layer 60, the metallization structure 54, the device layer 52, and the sidewalls of the substrate 50 are substantially coplanar to form the vertical sidewalls S1.

Fabrication of Second Dies

Referring to FIG. 2A and FIG. 2B, a wafer 40b is provided in a manner of fabricating the first dies 12a, and the passivation layer 60, the first redistribution layer 62, and the protective layers 70 are formed on the wafer 40b.

Figure 2C:
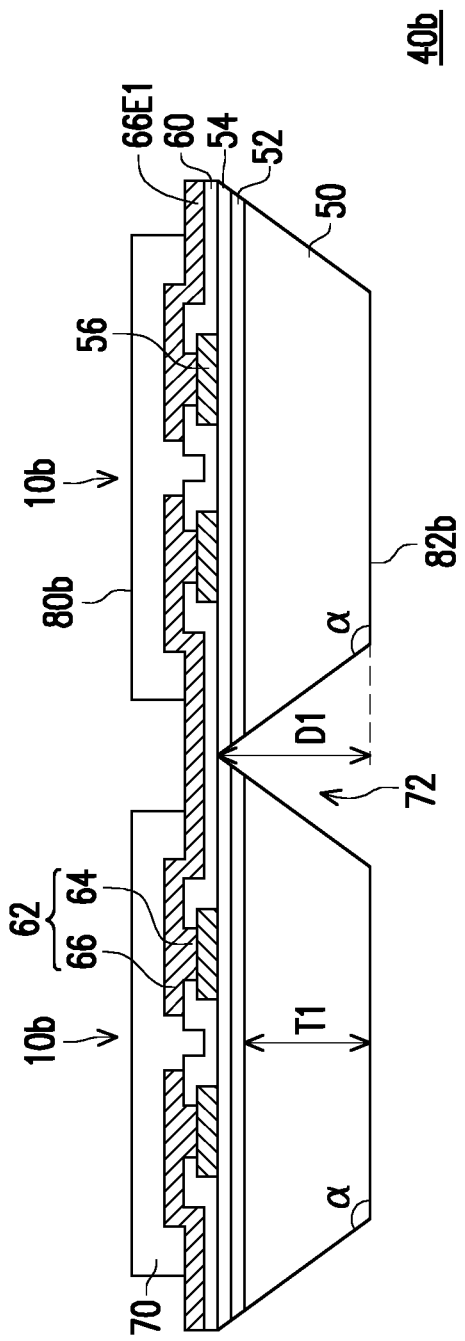
Figure 2D:
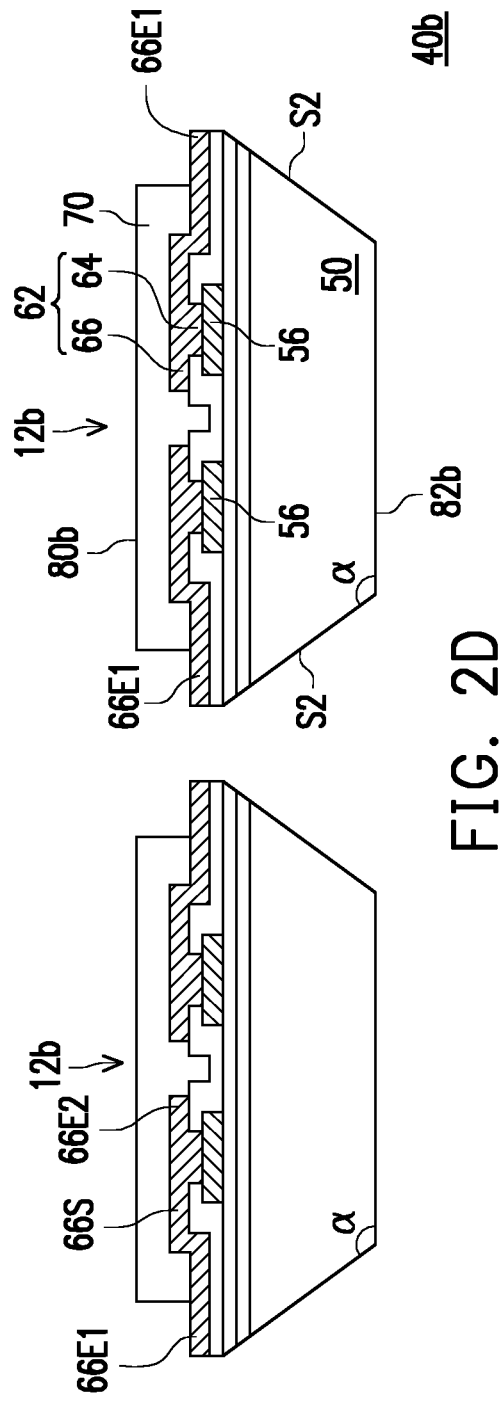
Figure 2E:
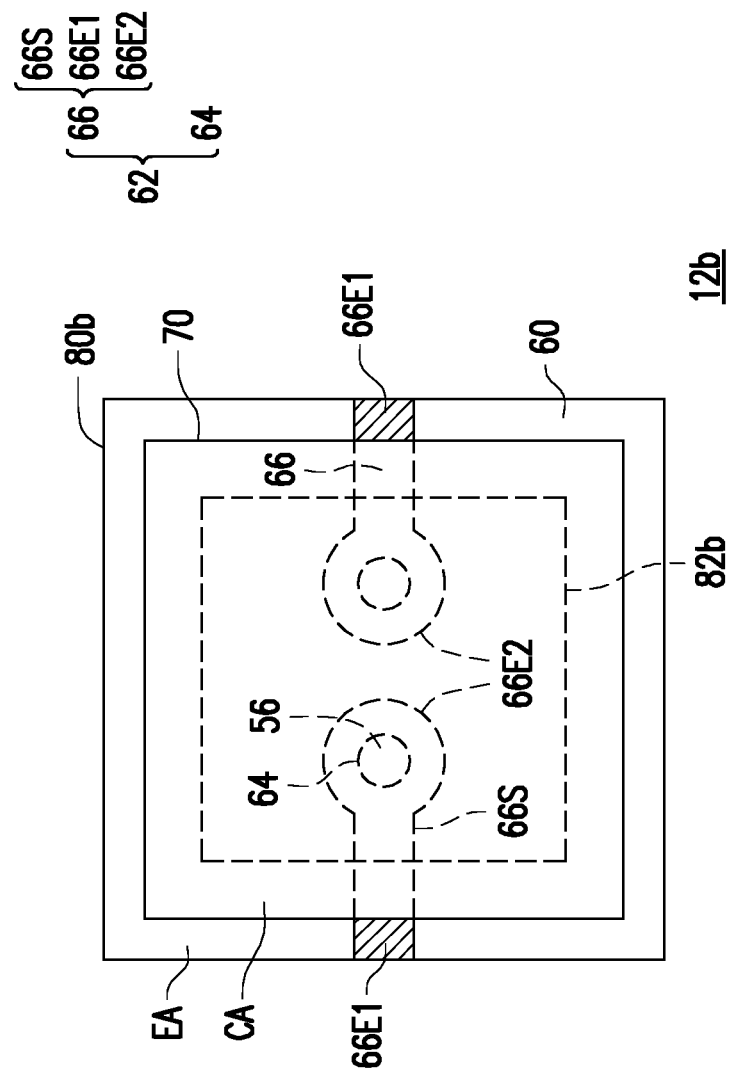
FIG. 2E is a top view of FIG. 2D.

Referring to FIG. 2C, before the dicing process, a wafer pre-cutting process is performed from a non-active surface 82b of chips 10b toward an active surface 80b thereof to form a recess 72 around the scribe line 58 of the wafer 40b. Two chips 10b adjacent to the recess 72 are partially separated. The recess 72 exposes the sidewalls of the chips 10b. The cross-sectional shape of the recess 72 is, for example, an inverted V shape. A depth D1 of the recess 72 may be less than, equal to, or greater than a total thickness T1 of the substrate 50. Referring to FIG. 2D and FIG. 2E, a dicing process is performed to completely separate the chips 10b on the wafer 40b from each other to form a plurality of second dies 12b. Referring to FIG. 2D and FIG. 2E, the area of the active surface 80b of the second dies 12b projected on the surface of the substrate 50 is greater than the area of the non-active surface 82b projected on the surface of the substrate 50.

The central region CA of the active surface 80b of the second dies 12b is covered by the protective layers 70. The edge region EA of the active face 80b of the second dies 12b is not covered by the protective layers 70, and a portion of the first redistribution layer 62 is exposed. In other words, the first redistribution layer 62 is located in a portion in the central region CA, that is, the ends (second ends) 66E2 of the first traces 66 connected to the pads 56 and the main body portions 66S of the first traces 66 are covered by the protective layers 70. The first redistribution layer 62 is located in another portion of the edge region EA, that is, the ends (first ends) 66E1 of the first traces 66 are not covered by the protective layers 70 and are exposed.

The second dies 12b have inclined sidewalls S2. An inner angle α between the sidewalls S2 and the bottom surface (the non-active surface 82b) of the substrate 50 is an obtuse angle. The sidewalls S2 of the second dies 12b are exposed and are not covered by the protective layers 70 and the passivation layer 60.

Fabrication of Third Dies

Referring to FIG. 3A, a wafer 40c is provided. The wafer 40c includes a plurality of chips 10c connected to each other. The wafer 40c and the chips 10c are similar to the wafer 40a and the chips 10a, respectively. Each of the chips 10c has an active surface 80c and a non-active surface 82c. The active surface 80c has the pads 56.

Referring to FIG. 3B, a wafer pre-cutting process is performed from the active surface 80c of the chips 10c toward the non-active surface 82c to form a recess 74 around the scribe line 58 of the wafer 40c. The recess 74 separates two adjacent chips 10c. The cross-sectional shape of the recess 74 is, for example, a V shape. The recess 74 exposes sidewalls S3 of the chips 10c. An inner angle β between the non-active surface 82c and the sidewalls S3 is an acute angle. The recess 74 is extended into the substrate 50 of the wafer 40c. A depth D2 of the recess 74 in the substrate 50 may be less than, equal to, or greater than the total thickness T1 of the substrate 50.

Figure 3C:
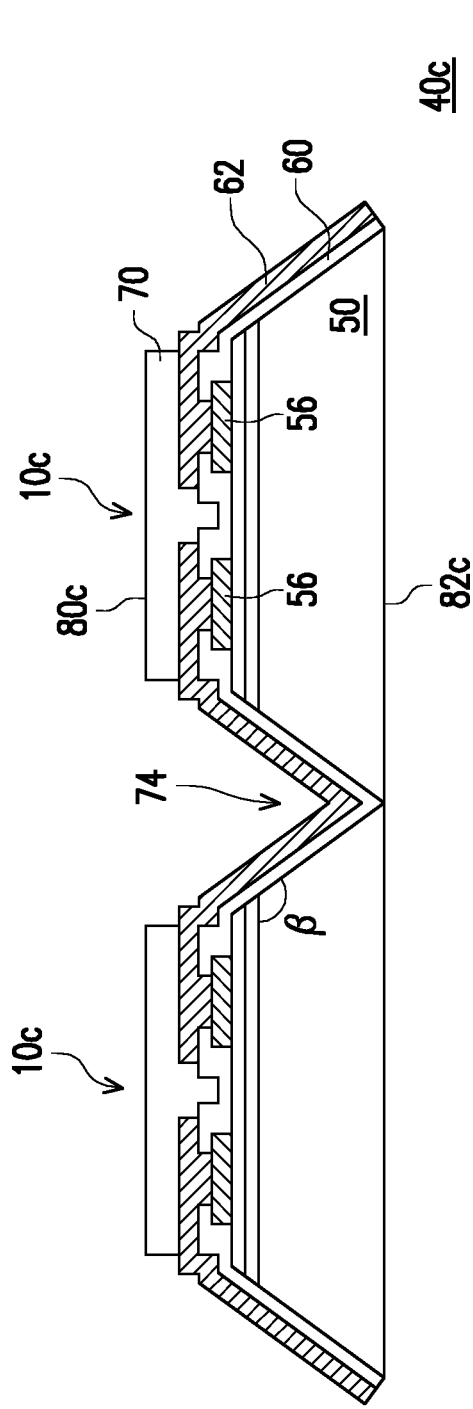

Referring to FIG. 3C, after a wafer pre-cutting process is performed, the passivation layer 60 and the first redistribution layer 62 are formed on the wafer 40c. The passivation layer 60 covers the surface of the chips 10c and the exposed sidewalls S3 of the recess 74, and the top via holes of the passivation layer 60 expose the surface of the pads 56. The first redistribution layer 62 is formed on the passivation layer 60 on the chips 10c and the recess 74, and is electrically connected to the pads 56.

Referring to FIG. 3C, the plurality of protective layers 70 are formed on the wafer 40a. The protective layers 70 cover the passivation layer 60 and the first redistribution layer 62 located in the central region of the chips 10c. The protective layers 70 expose the edge region of the chips 10c and the passivation layer 60 and the first traces 66 on the sidewalls S3.

Figure 3D:
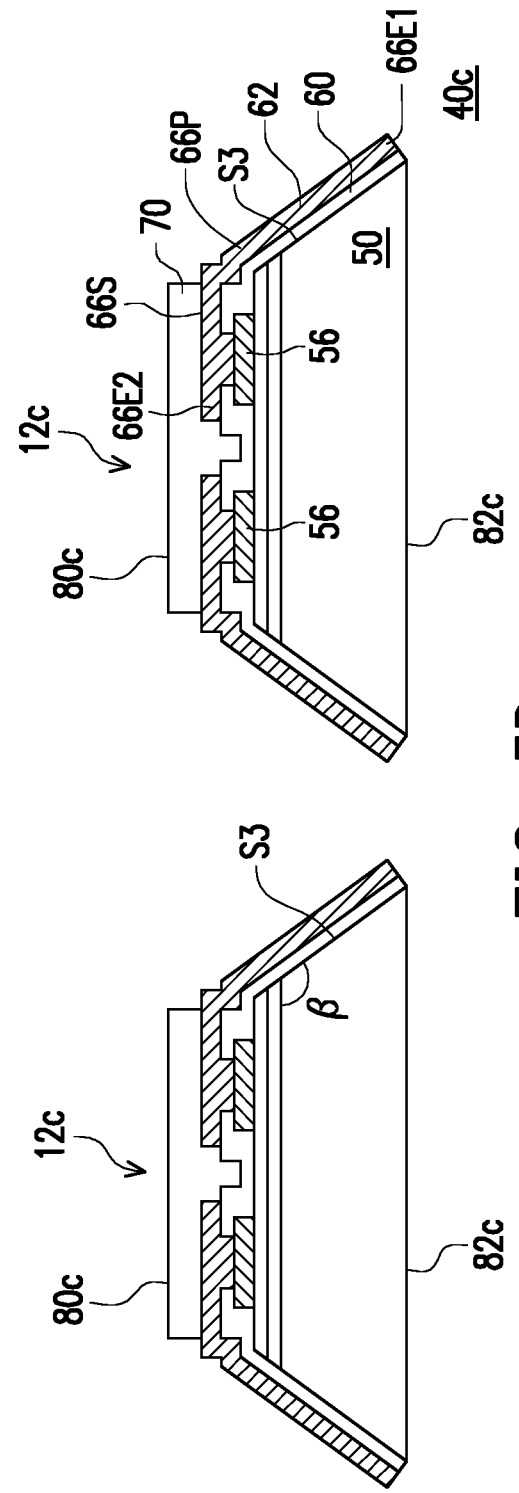
Figure 3E:
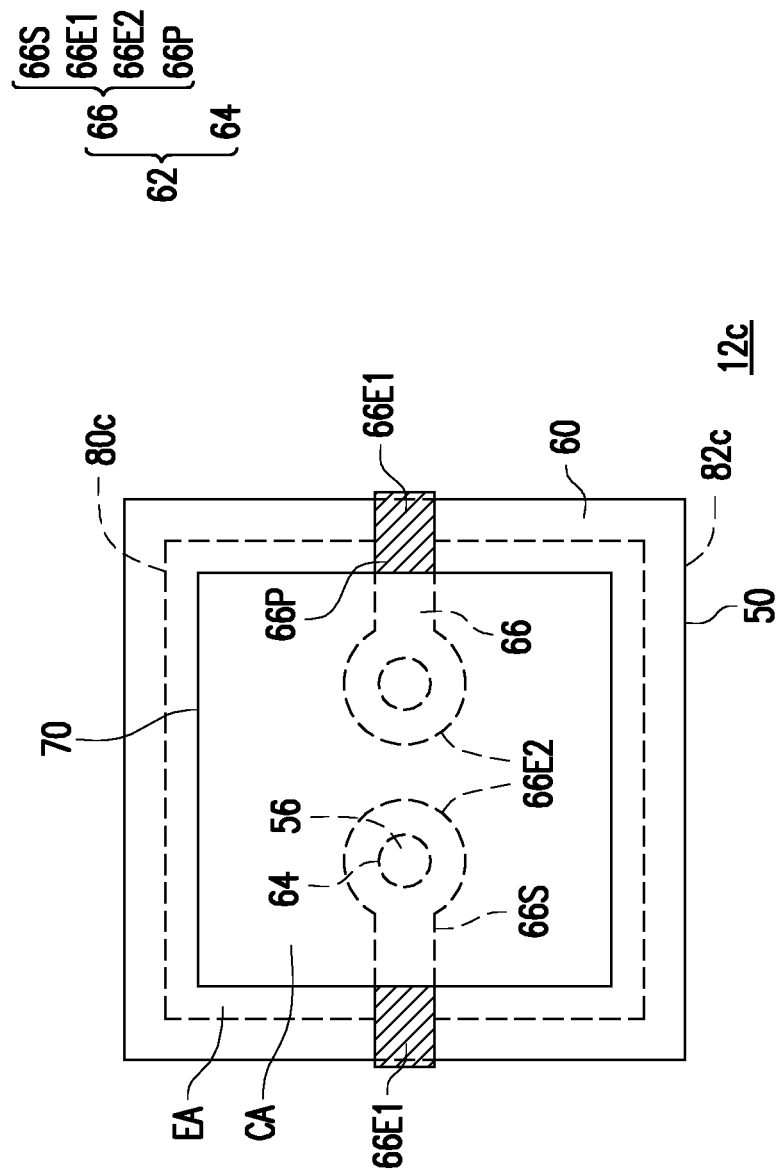
FIG. 3E is a top view of FIG. 3D.

Referring to FIG. 3D and FIG. 3E, a dicing process is performed from the recess 74 to separate the chips 10c on the wafer 40c from each other to form a plurality of third dies 12c. The area of the active surface 80c of the third dies 12c projected on the surface of the substrate 50 is smaller than the area of the non-active surface 82c projected on the surface of the substrate 50. The third dies 12b have the inclined sidewalls S3. The sidewalls S3 are covered by the passivation layer 60, and the passivation layer 60 on the sidewalls S3 has the first redistribution layer 62 thereon.

The central region CA of the active surface 80c of the second dies 12c is covered by the protective layers 70. The edge region EA and the sidewalls S3 of the third dies 12c are not covered by the protective layers 70, and a portion of the passivation layer 60 and a portion of the first redistribution layer 62 are exposed. In other words, the first traces 66 are located in a portion in the central region CA, that is, the ends (second ends) 66E2 of the first traces 66 connected to the pads 56 and the main body portions 66S of the first traces 66 are covered by the protective layers 70. Portions 66P of the first traces 66 located on the edge region EA and the sidewalls S3 and the ends (first ends) 66E1 thereof are not covered by the protective layers 70 and are exposed.

Fabrication of Fourth Dies

Referring to FIG. 4A, a wafer 40d is provided. The wafer 40d includes a plurality of chips 10d connected to each other. The wafer 40d and the chips 10d are similar to the wafer 40a and the chips 10a, respectively. Each of the chips 10d has an active surface 80d and a non-active surface 82d. The active surface 80d has the pads 56.

Figure 4C:
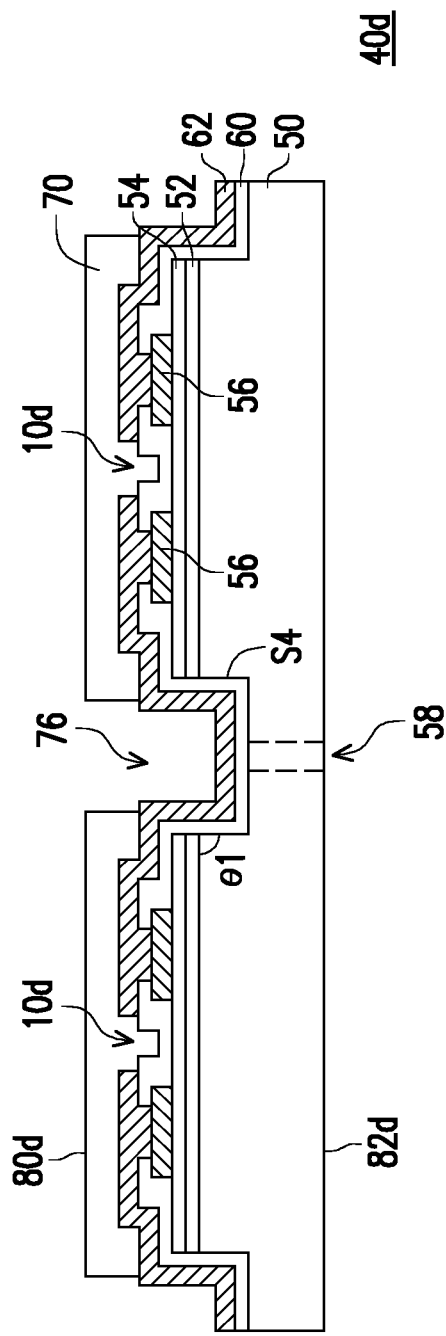

Referring to FIG. 4B, a lithography and etching process is performed from the active surface 80d of the chips 10d toward the non-active surface 82d to form a recess 76 around the scribe line 58 of the wafer 40d. The recess 76 partially separates two adjacent chips 10d. The cross-sectional shape of the recess 76 is, for example, a U shape. The shape of the recess 76 may vary slightly depending on the etching process. Sidewalls S4 of the recess 76 formed by an anisotropic etching process are substantially vertical planes or inclined planes. An angle θ1 between the sidewalls S4 and the surface of the substrate 50 of the wafer 40d is an acute angle or a right angle. The recess 76 is extended into the substrate 50. A depth D3 of the recess 76 in the substrate 50 is less than the total thickness T1 of the substrate 50. Referring to FIG. 4C, the passivation layer 60 is formed on the wafer 40d to cover the surface of the chips 10d and the sidewalls S4 and the bottom surface of the recess 76 to expose the surface of the pads 56. The first redistribution layer 62 is formed on the passivation layer 60, and the first redistribution layer 62 is electrically connected to the pads 56. The first redistribution layer 62 covers the surface of the pads 56 and is extended over the passivation layer 60 on the edge of the chips 10d and a portion of the passivation layer 60 on the recess 76.

Figure 4D:
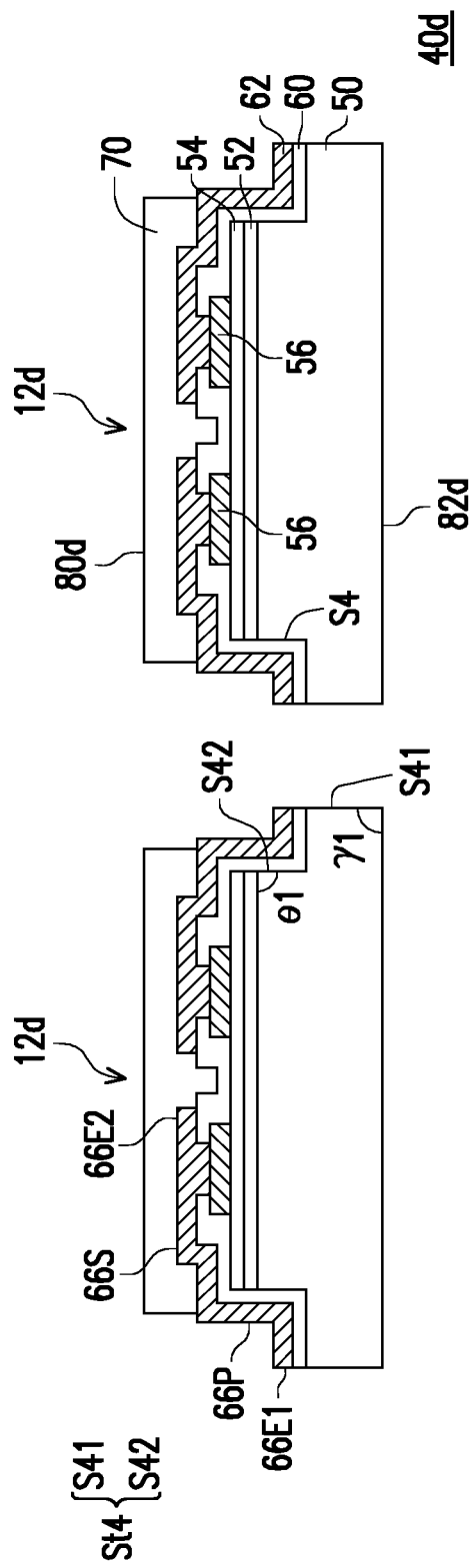
Figure 4E:
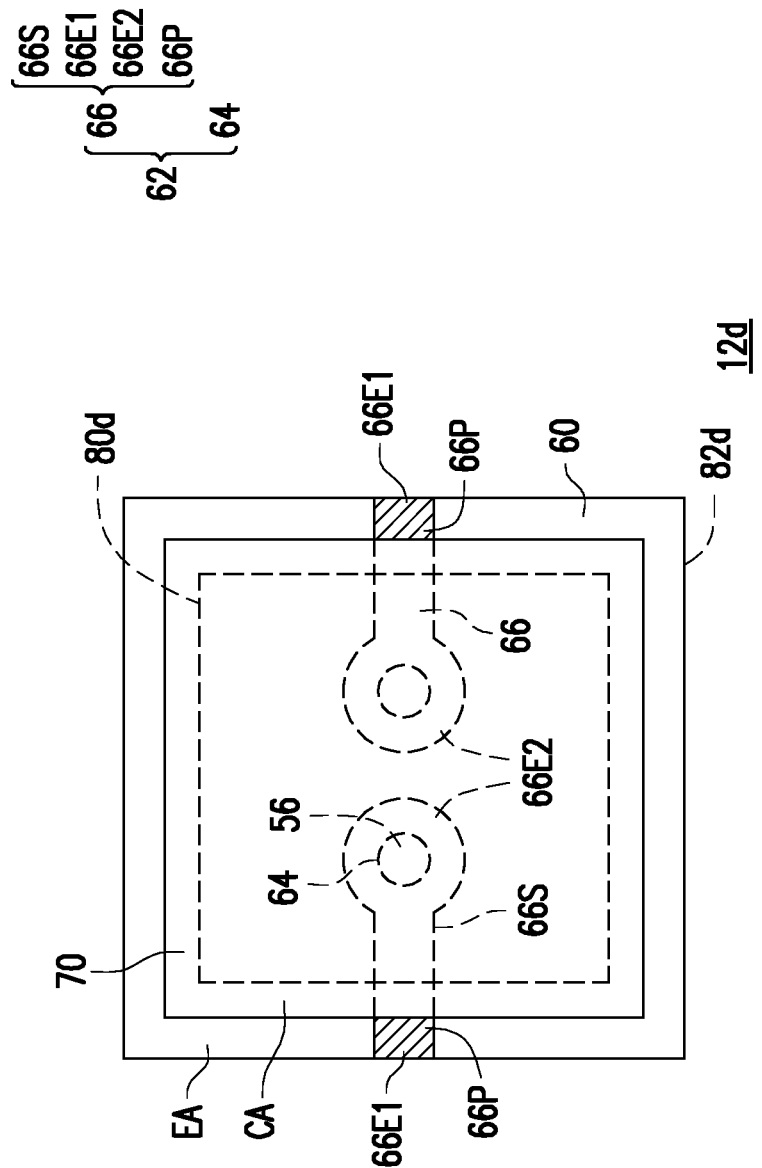
FIG. 4E is a top view of FIG. 4D.

Referring to FIG. 4D, a dicing process is performed from the bottom surface of the recess 76 to separate the chips 10d on the wafer 40 from each other to form a plurality of fourth dies 12d.

The area of the active surface 80d of the fourth dies 12d projected on the surface of the substrate 50 is smaller than the area of the non-active surface 82d projected on the surface of the substrate 50. The fourth dies 12d have stepped sidewalls St4. The stepped sidewalls St4 include first sidewalls S41 and second sidewalls S42. An angle γ1 between the first sidewalls S41 and the non-active surface 82a may be a right angle. The first sidewalls S41 expose the substrate 50, which is not covered by the passivation layer 60 and is also not covered by the first redistribution layer 62. An angle θ1 between the second sidewalls S42 and the surface of the substrate 50 is an acute angle or a right angle. The second sidewalls S41 are covered by the passivation layer 60, and the passivation layer 60 on the second sidewalls S41 has the first redistribution layer 62 thereon.

The central region CA of the active surface 80d of the fourth dies 12c is covered by the protective layers 70. The edge region EA and the sidewalls St4 of the fourth dies 12d are not covered by the protective layers 70, and a portion of the passivation layer 60 and a portion of the first redistribution layer 62 are exposed. In other words, the first traces 66 are located in a portion in the central region CA, that is, the ends (second ends) 66E2 of the first traces 66 connected to the pads 56 and the main body portions 66S of the first traces 66 are covered by the protective layers 70. The portions 66P of the first traces 66 located on the edge region EA and the sidewalls St4 and the ends (first ends) 66E1 thereof are not covered by the protective layers 70 and are exposed.

Fabrication of Fifth Dies

Figure 5A:
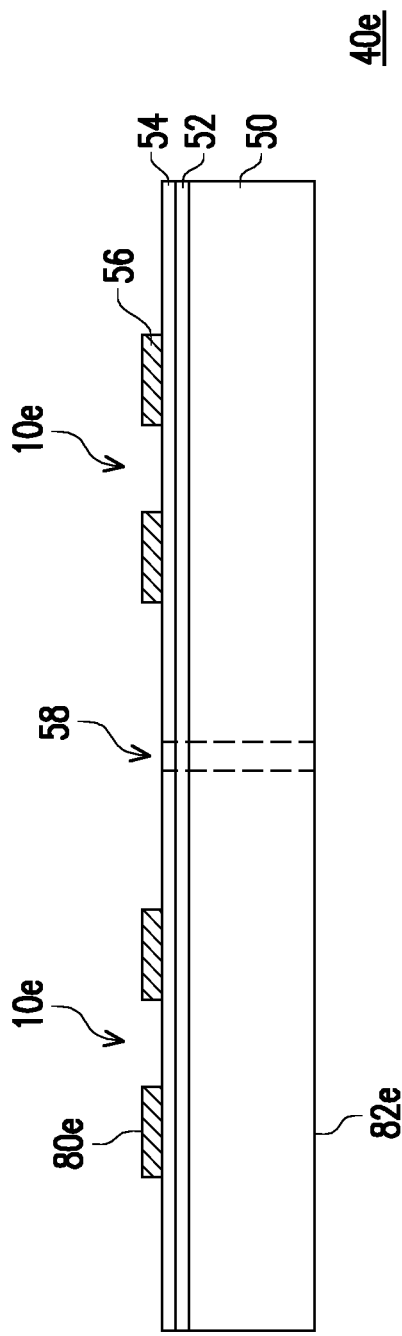
FIGS. 5A to 5D are schematic cross-sectional views of a fabrication process of fifth dies according to an embodiment of the disclosure.
Figure 5B:
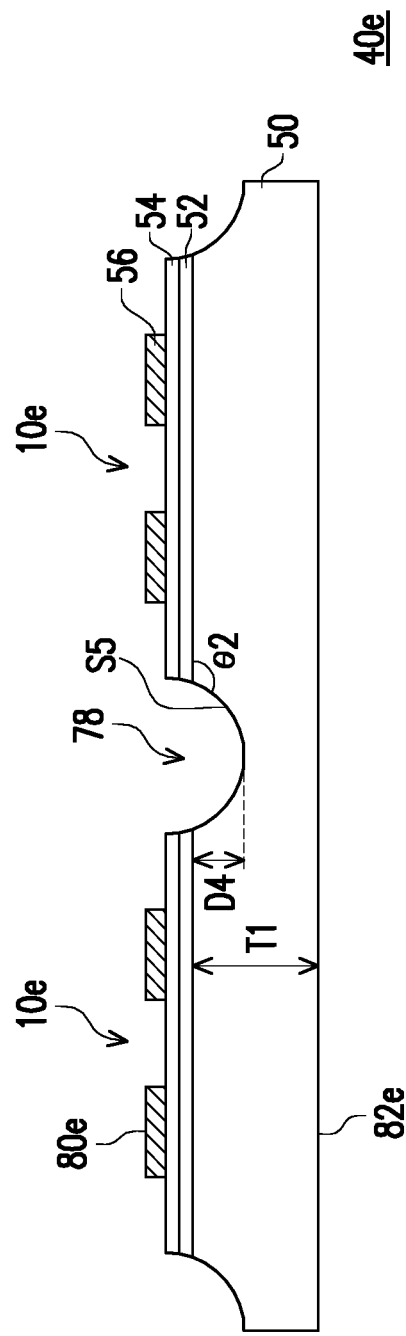
Figure 5C:
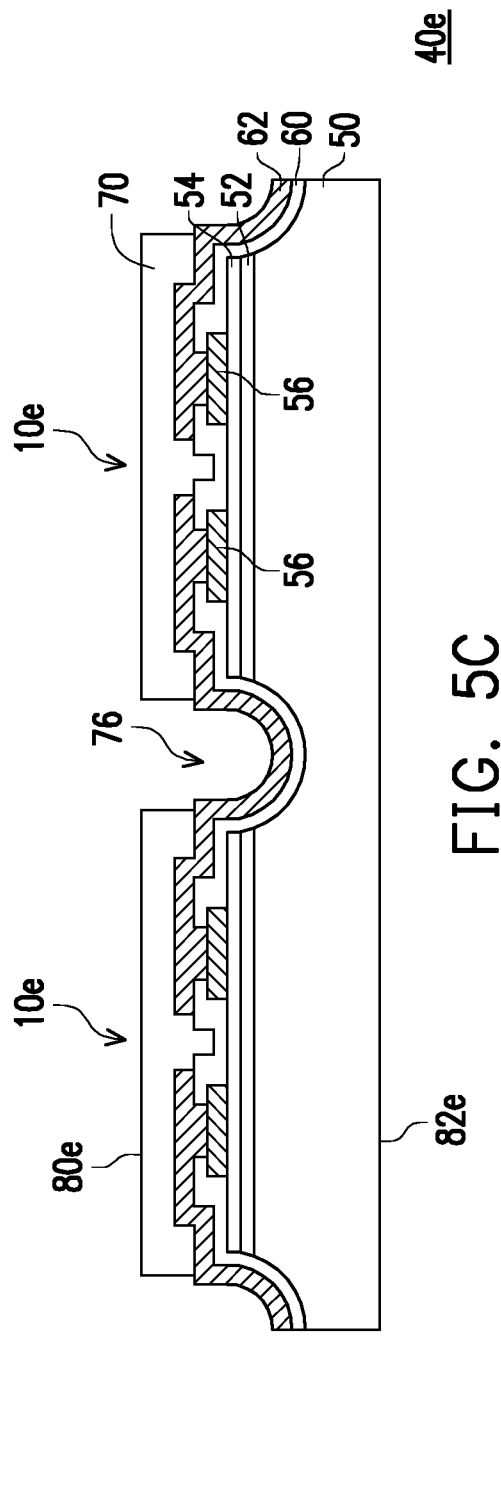

Referring to FIGS. 5A to 5C, fifth dies 12e are fabricated in a similar manner to the fourth dies 12d. The difference is that a recess 78 is formed by a lithography and isotropic etching process. The cross-sectional shape of the recess 78 formed by the isotropic etching process is, for example, a U-shape, but the recess 78 has arc-shaped sidewalls S5. An angle θ2 between the sidewalls S5 of the recess 78 and the surface of the substrate 50 is a right angle or an obtuse angle. The recess 78 is extended into the substrate 50. A depth D4 of the recess 78 in the substrate 50 is less than the total thickness T1 of the substrate 50.

Figure 5D:
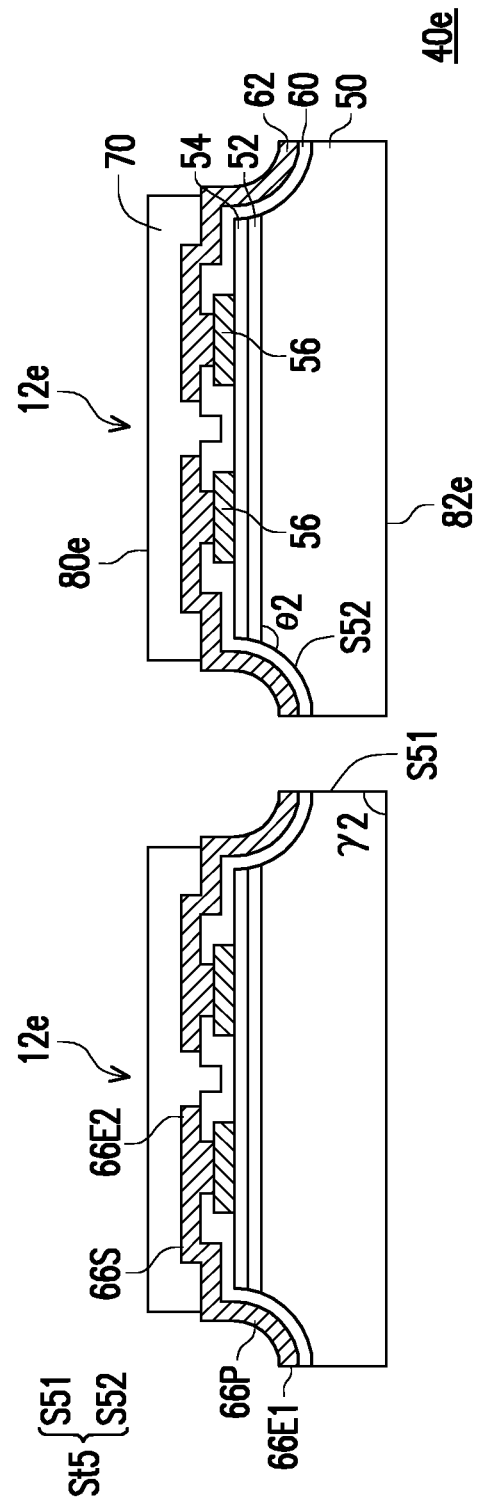
Figure 5E:
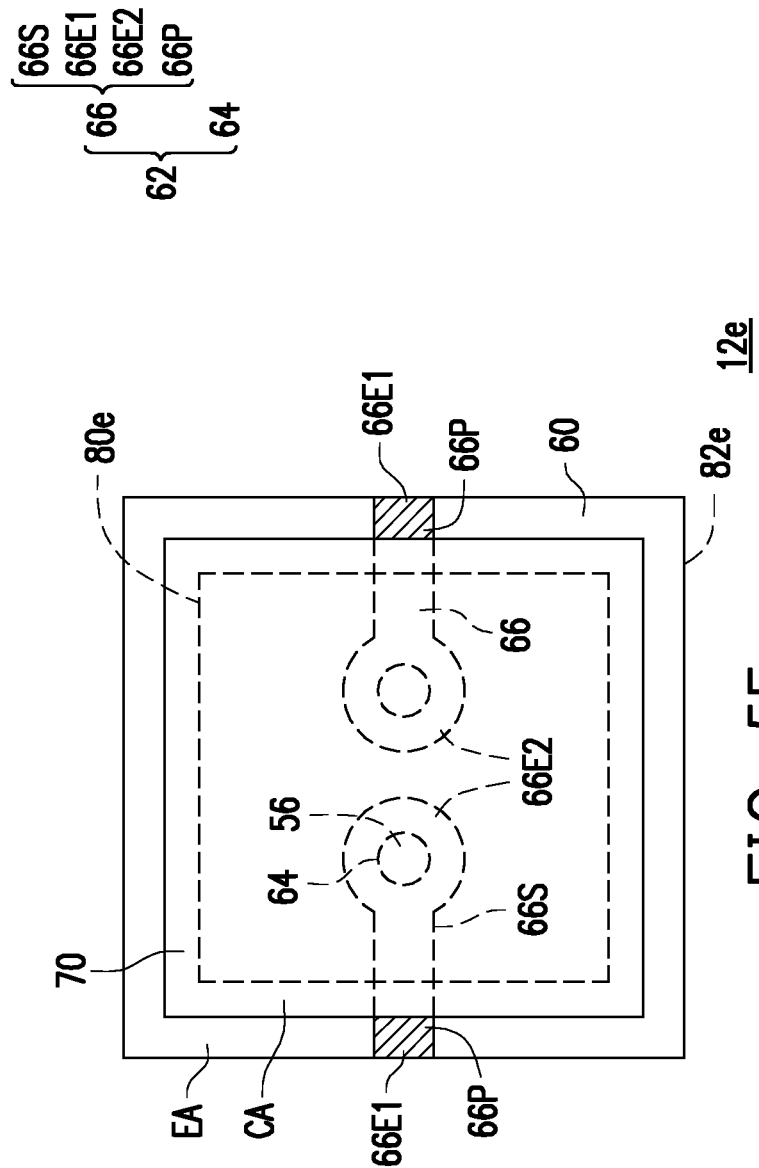
FIG. 5E is a top view of FIG. 5D.

Referring to FIG. 5D and FIG. 5E, a dicing process is performed from the bottom surface of the recess 78 to separate chips 10e on a wafer 40e from each other to form the plurality of fifth dies 12e.

The fifth dies 12e are similar to the fourth dies 12d. The area of the active surface 80e of the fifth dies 12e projected on the surface of the substrate 50 is smaller than the area of the non-active surface 82a projected on the surface of the substrate 50, and the fifth dies 12e also have stepped sidewalls St5. The stepped sidewalls St5 include first sidewalls S51 and second sidewalls S52. An angle γ2 between the first sidewalls S51 and the non-active surface 82a may be a right angle. The first sidewalls S51 expose the substrate 50, which is not covered by the passivation layer 60 and is also not covered by the first redistribution layer 62. An angle θ2 between the second sidewalls S52 and the surface of the substrate 50 is an acute angle or a right angle. The second sidewalls S51 are covered by the passivation layer 60, and the passivation layer 60 on the second sidewalls S51 is covered by the first redistribution layer 62.

Figure 12:
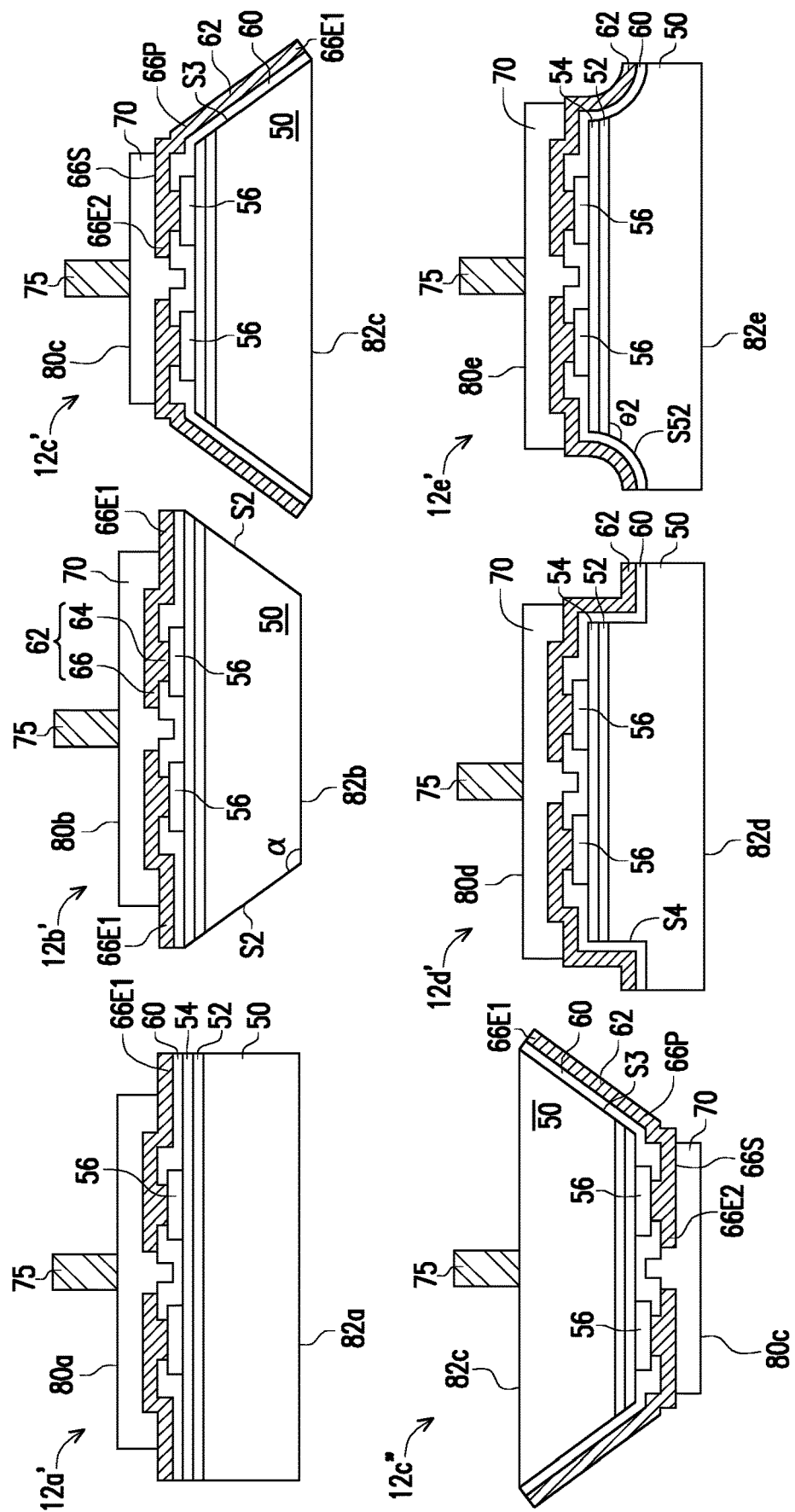
FIG. 12 is a schematic cross-sectional view of a plurality of dies according to an embodiment of the disclosure.

Referring to FIG. 12, during the fabrication of the first dies 12a, the second dies 12b, the third dies 12c, the fourth dies 12d, and the fifth dies 12e, a protrusion 75 may be formed above the protective layers 70 or above the substrate 50 before dicing is performed, such as dies 12a', 12b', 12c', 12c'', 12d', and 12e' in FIG. 12. The protrusion 75 may be made of a dielectric material, a semiconductor material, or a metal material. The protrusion 75 may be formed by, for example, a lithography and etching process. The protrusion 75 may provide freedom of access to the chips during assembly. Additionally, the protrusion 75 may be used as a portion of the architecture after assembly.

The dies may be attached on the substrate by a wafer-level or a panel-level process, and a plurality of dies may be attached on the substrate at the same time in batches. However, for simplicity, the following embodiments are exemplified by a single die.

First Embodiment

Figure 6A:
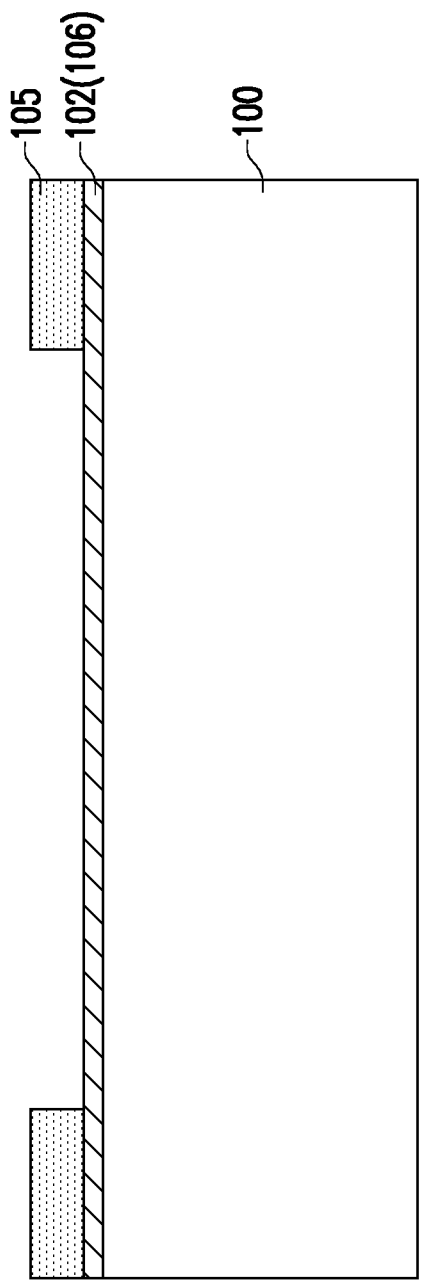
FIGS. 6A to 6D are schematic cross-sectional views of a fabrication process of a hetero-integrated structure according to the first embodiment of the disclosure.

Referring to FIG. 6A, a substrate 100 is provided. The material of the substrate 100 may be an organic material or an inorganic material. The substrate 100 may be a package substrate such as a flexible substrate, an interposer substrate, or a printed-circuit board. Alternatively, the substrate 100 may be, for example, a semiconductor wafer containing a plurality of semiconductor chips or a reconstructed wafer containing a plurality of dies. The substrate 100 may be, for example, a semiconductor die or a semiconductor chip on which a semiconductor integrated circuit is formed, including a memory chip, a logic chip, a digital chip, an analog chip, a sensor chip, a radio frequency chip, or a voltage regulator chip, or the like. In particular, the sensor chip may be an image sensor chip, and at least includes a charge-coupled device or a complementary MOS image sensor.

A second redistribution layer 102 is formed on the substrate 100. In some embodiments, a dielectric layer is further included between the substrate 100 and the second redistribution layer 102, or other device layers are further included. The second redistribution layer 102 is also referred to as a second circuit layer. The second redistribution layer 102 may include vias (not shown) and traces 106. The material of the second redistribution layer 102 includes a metal such as copper, nickel, titanium, a combination thereof, or the like. The second redistribution layer 102 may be formed by an electroplating or electroless plating process. In some embodiments, the second redistribution layer 102 includes a seed layer (not shown) and a metal layer (not shown) formed thereon. The seed layer may be a metal seed layer, such as a copper seed layer. In some embodiments, the seed layer includes a first metal layer (e.g., a titanium layer) and a second metal layer (e.g., a copper layer on the first metal layer). The metal layer on the seed layer may be copper or other suitable metals.

Figure 6B:
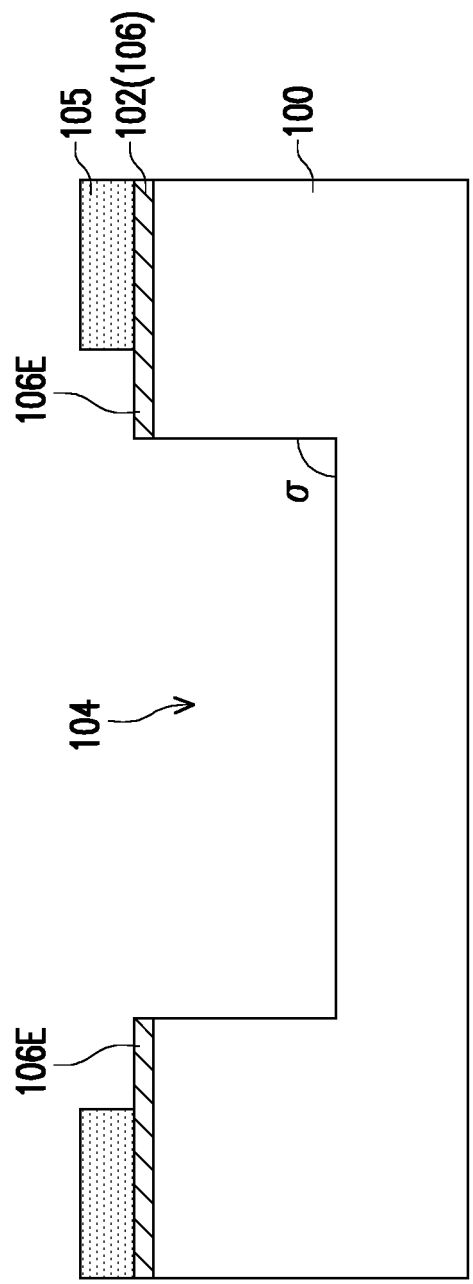

Referring to FIG. 6B, a portion of the substrate 100 and a portion of the second redistribution layer 102 are removed to form a plurality of cavities 104 in the substrate 100. The portion of the substrate 100 is removed by, for example, a lithography and etching process. A bottom angle α of the cavities 104 is, for example, a right angle or an obtuse angle.

Referring to FIG. 6B, protective layers 105 are formed on the substrate 100. The protective layers 105 cover a portion of the second redistribution layer 102. The protective layers 105 expose ends 106E of the traces 106 of the second redistribution layer 102 around the cavities 104. The material of the protective layers 105 may be the same as or different from the material of the protective layers 70. The protective layers 105 may be a single-layer structure or a multilayer structure. The protective layers 105 may be an insulating material. The protective layers 105 may be an inorganic material or an organic material such as silicon oxide, silicon nitride, a polymer, or a combination thereof. The polymer is, for example, polybenzoxazole (PBO), polyimide (PI), benzocyclobutene (BCB), a combination thereof, or the like.

Figure 6C:
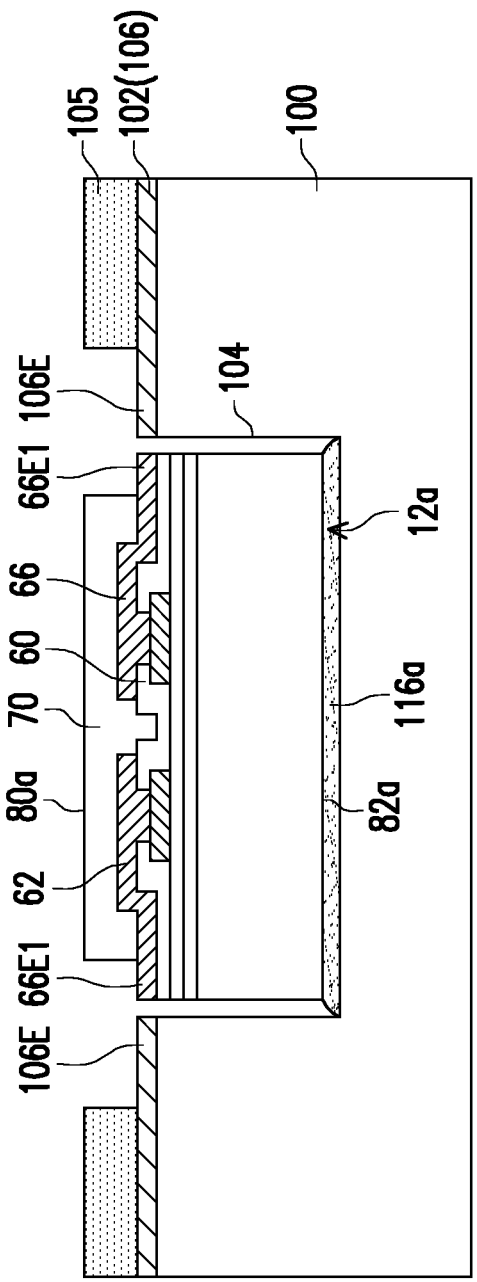

Referring to FIG. 6C, an adhesive layer 116a is formed in the cavities 104 of the substrate 100. The material of the adhesive layer 116a may be an organic material or an inorganic material. The organic material is, for example, an epoxy resin, polydimethyl siloxane (PDMS), or the like. The inorganic material includes an oxide such as silicon oxide. In some embodiments, the adhesive layer 116a may be formed in the cavities 104 of the substrate 100 in solid state. In some other embodiments, the adhesive layer 116a may be formed in the cavities 104 of the substrate 100 in liquid state, and may be cured by heating after the subsequent placement of the dies in the cavities 104.

Referring to FIG. 6C, the non-active surface 82a of the plurality of first dies 12a is oriented toward the substrate 100 in a pick and place manner, and the first dies 12a are attached in the plurality of cavities 104. The ends 66E1 of the first redistribution layer 62 on the active surface 80a of the first dies 12a are aligned with the ends 106E of the traces 106 of the second redistribution layer 102 on the substrate 100, and the non-active surface 82a of the first dies 12a is in contact with the adhesive layer 116a in the cavities 104. In an embodiment in which the adhesive layer 116a is in liquid state, after the first dies 12a are placed in the cavities 104, the first dies 12a are cured by low-temperature heating. By appropriate control of the thickness/volume of the adhesive layer 116a, adhesive overflow may be avoided, and after the adhesive layer 116a is cured, the surface of the first redistribution layer 62 and the surface of the second redistribution layer 102 may be made to be substantially at the same height. In an embodiment, the surface of the first redistribution layer 62 and the surface of the second redistribution layer 102 are coplanar.

Figure 6D:
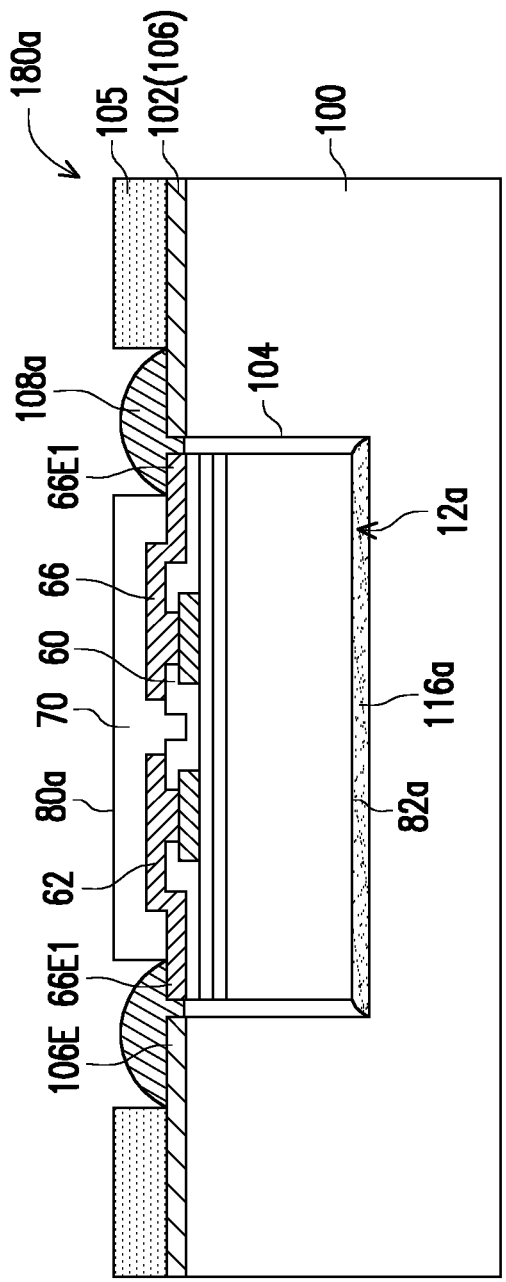

Referring to FIG. 6D and FIG. 6E, connecting portions 108a are formed at the ends 66E1 of the first redistribution layer 62 and the ends 106E of the traces 106 of the second redistribution layer 102 to connect the first redistribution layer 62 and the second redistribution layer 102. The connecting portions 108a may be formed by electroplating, electroless plating, or the like. In an embodiment in which the connecting portions 108a are formed by electroplating or electroless plating, in the initial stage of the process, a first conductive material and a second conductive material are respectively formed at the ends 66E1 of the first redistribution layer 62 and the ends 106E of the traces 106 of the second redistribution layer 102. The first conductive material surrounds and covers a top surface and sidewalls of the ends 66E1 of the first redistribution layer 62. The second conductive material surrounds and covers a top surface and sidewalls of the ends 106E of the traces 106 of the second redistribution layer 102. In the later stage of the process, after the first conductive material and the second conductive material gradually grow outward and come in contact with each other, the connecting portions 108a may be formed. In other words, the connecting portions 108a may be self-aligned with the ends 66E1 of the first redistribution layer 62 and the ends 106E of the traces 106 of the second redistribution layer 102 by electroplating or electroless plating. The temperature at which the electroplating and electroless plating processes are performed is relatively low, such as 100 degrees Celsius or less, and therefore, the dies may be bonded to the substrate 100 in a low-temperature manner.

In an embodiment in which the connecting portions 108a are formed by electroplating or electroless plating, the connecting portions 108a cover the top surface and the sidewalls of the ends 66E1 of the first redistribution layer 62 and the top surface and the sidewalls of the ends 106E of the traces 106 of the second redistribution layer 102. Therefore, a width W31 of the connecting portions 108a is greater than a width W11 of the traces 66 of the first redistribution layer 62 and greater than a width W21 of the second redistribution layer 102. Further, the shape of the connecting portions 108a is, for example, irregular or a curved contour.

At this point, a hetero-integrated structure 180a is formed. Next, a dicing process may be further performed. The protective layers 70 and 105 may be removed before the dicing process or retained.

Second Embodiment

Referring to FIG. 7A, the substrate 100 is provided in the manner of the first embodiment. The substrate 100 has the second redistribution layer 102 and the protective layers 105 thereon. The substrate 100 has the plurality of cavities 104.

Referring to FIG. 7B, an adhesive layer 116b is formed in the cavities 104 of the substrate 100, and the non-active surface 82b of the plurality of second dies 12b is oriented toward the substrate 100 in a pick and place manner, so as to be attached in the cavities 104. The non-active surface 82b of the second dies 12b is in contact with the adhesive layer 116b, and the ends 66E of the first redistribution layer 62 are aligned with the ends 106E of the traces 106 of the second redistribution layer 102.

Figure 7C:
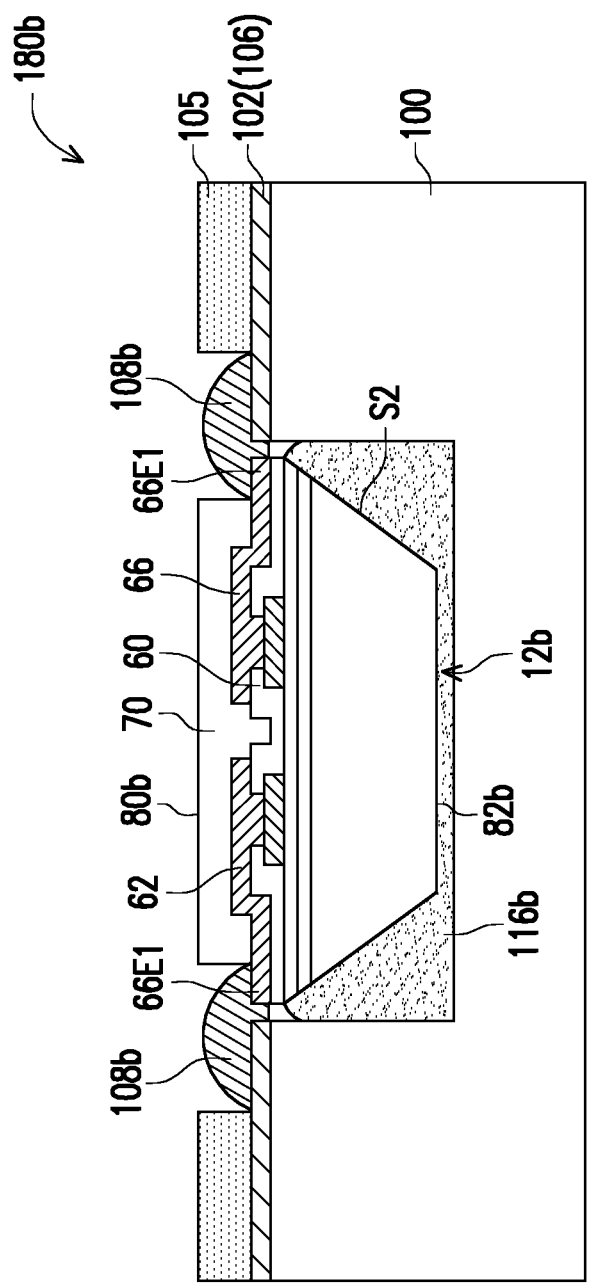
Figure 7D:
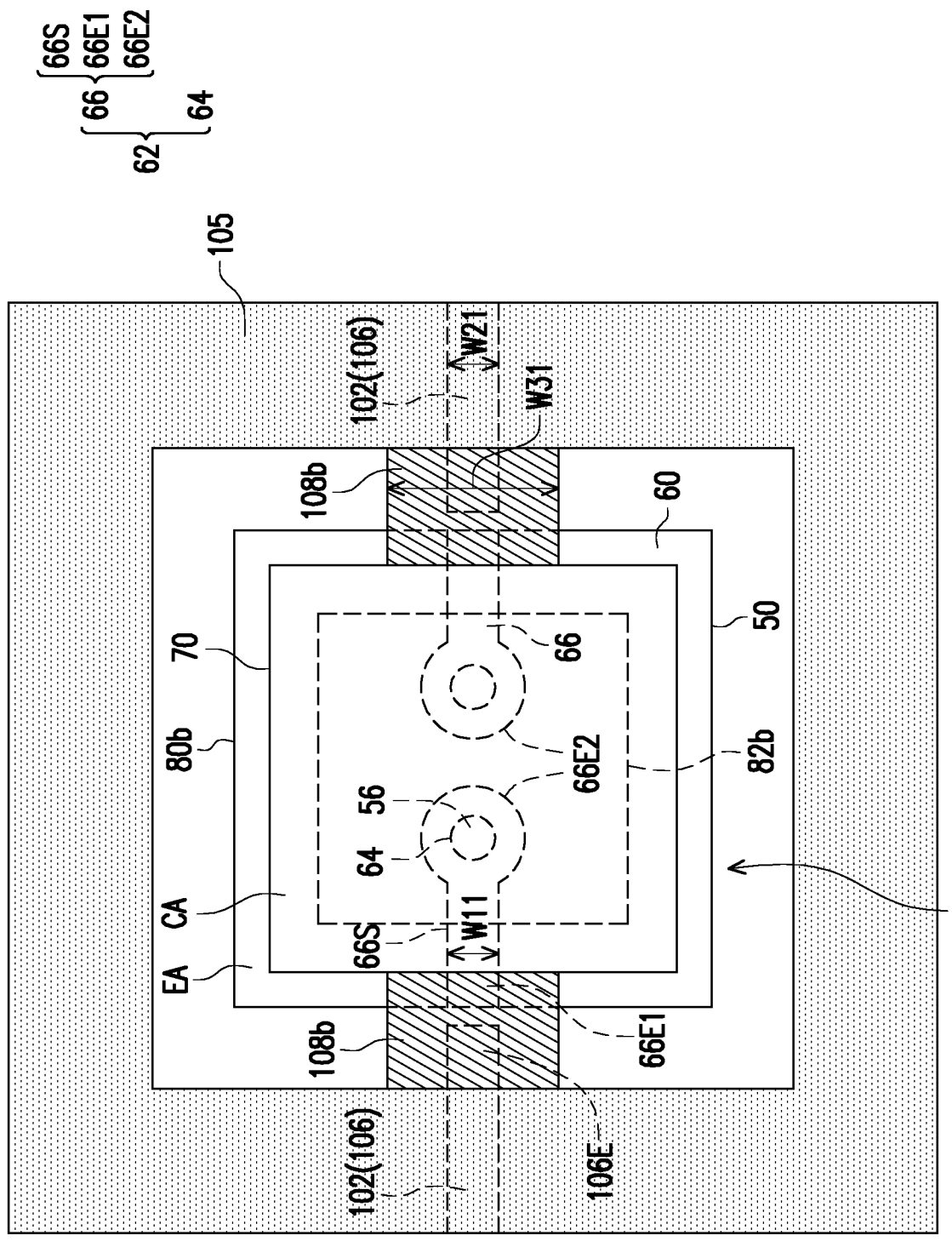
FIG. 7D is a top view of FIG. 7C.

Referring to FIGS. 7C and 7D, connecting portions 108b are formed on the surface and the sidewalls of the ends 66E1 of the first redistribution layer 62 and on the surface and the sidewalls of the ends 106E of the traces 106 of the second redistribution layer 102 to connect the first redistribution layer 62 and the second redistribution layer 102. The method of forming the connecting portion 108b and the contour thereof are similar to the method of forming the connecting portions 108a and the contour thereof and are not repeated herein.

At this point, a hetero-integrated structure 180b is formed. Next, a dicing process may be further performed. The second dies 12b in the hetero-integrated structure 180b have the inclined sidewalls S2. The area of the active surface 80b of the second dies 12b projected on the surface of the substrate 50 is smaller than the area of the non-active surface 82b projected on the surface of the substrate 50. The inner angle α between the non-active surface 82a and the sidewalls S2 is an obtuse angle. The adhesive layer 116b is in contact with the non-active surface 82a of the dies and in contact with the sidewalls S2 of the second dies 12b.

Third Embodiment

Referring to FIG. 8A, the substrate 100 having a flat surface is provided. The second redistribution layer 102 and the protective layers 105 are formed on the substrate 100.

Referring to FIG. 8B, an adhesive layer 116c is formed on the substrate 100 between the second redistribution layer 102 of the substrate 100. The adhesive layer 116c may be formed on the substrate 100 in liquid state. In an embodiment, the liquid adhesive layer 116c is hydrophilic and the second redistribution layer 102 is hydrophobic.

Referring to FIG. 8B, the non-active surface 82a of the plurality of third dies 12c is oriented toward the substrate 100 in a pick and place manner, so that the third dies 12c are attached on the flat surface of the substrate. The non-active surface 82a of the third dies 12c is in contact with the adhesive layer 116c, and the ends 66E1 of the traces 66 on the sidewalls S3 of the third dies 12c are aligned with the ends 106E of the traces 106 of the second redistribution layer 102 on the substrate 100.

Referring to FIG. 9A, in an embodiment, before attaching, the adhesive layer 116c is a hydrophilic solid, colloid, or a liquid; and the second redistribution layer 102 is a solid and hydrophobic.

Referring to FIG. 9B, a hydrophilic droplet 120a, such as a water droplet, may be applied to the adhesive layer 116c. A portion of the droplet 120a covers the second redistribution layer 102 as shown in FIG. 9B.

Figure 9C:
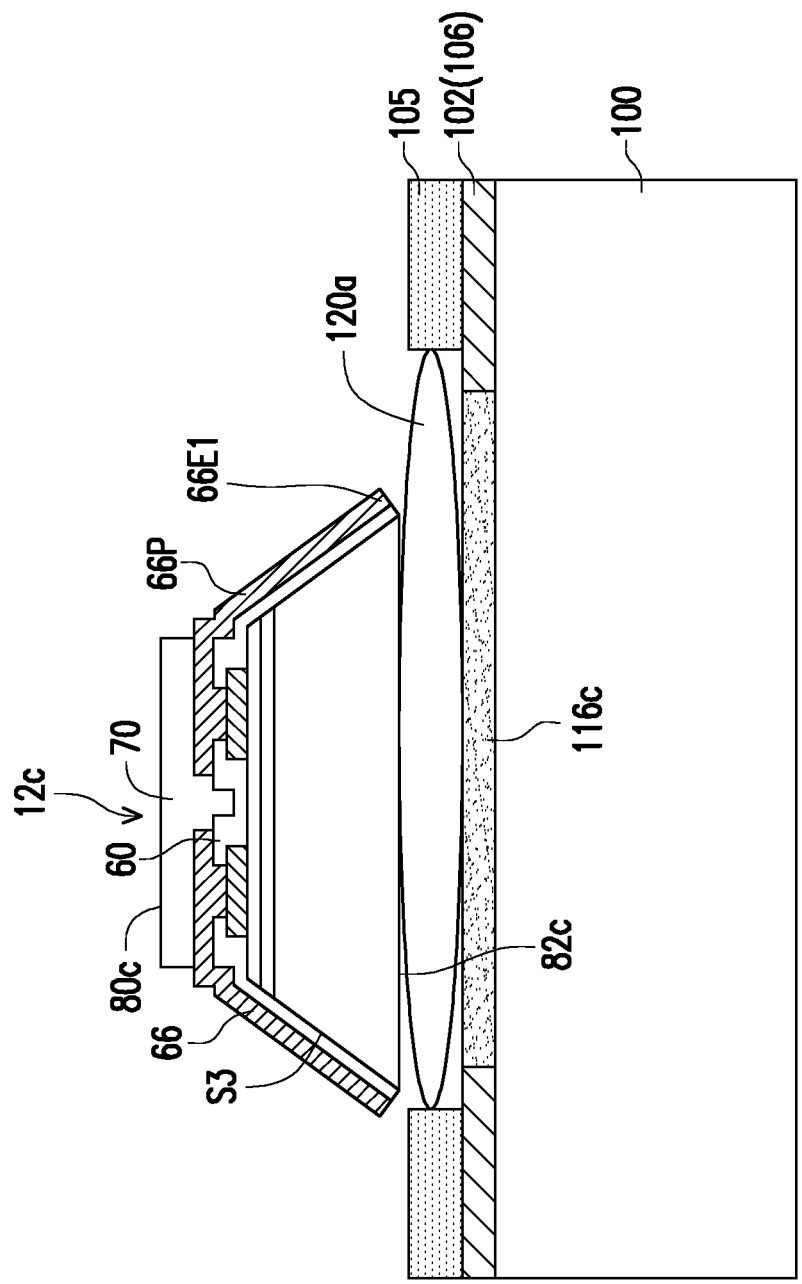
Figure 9D:
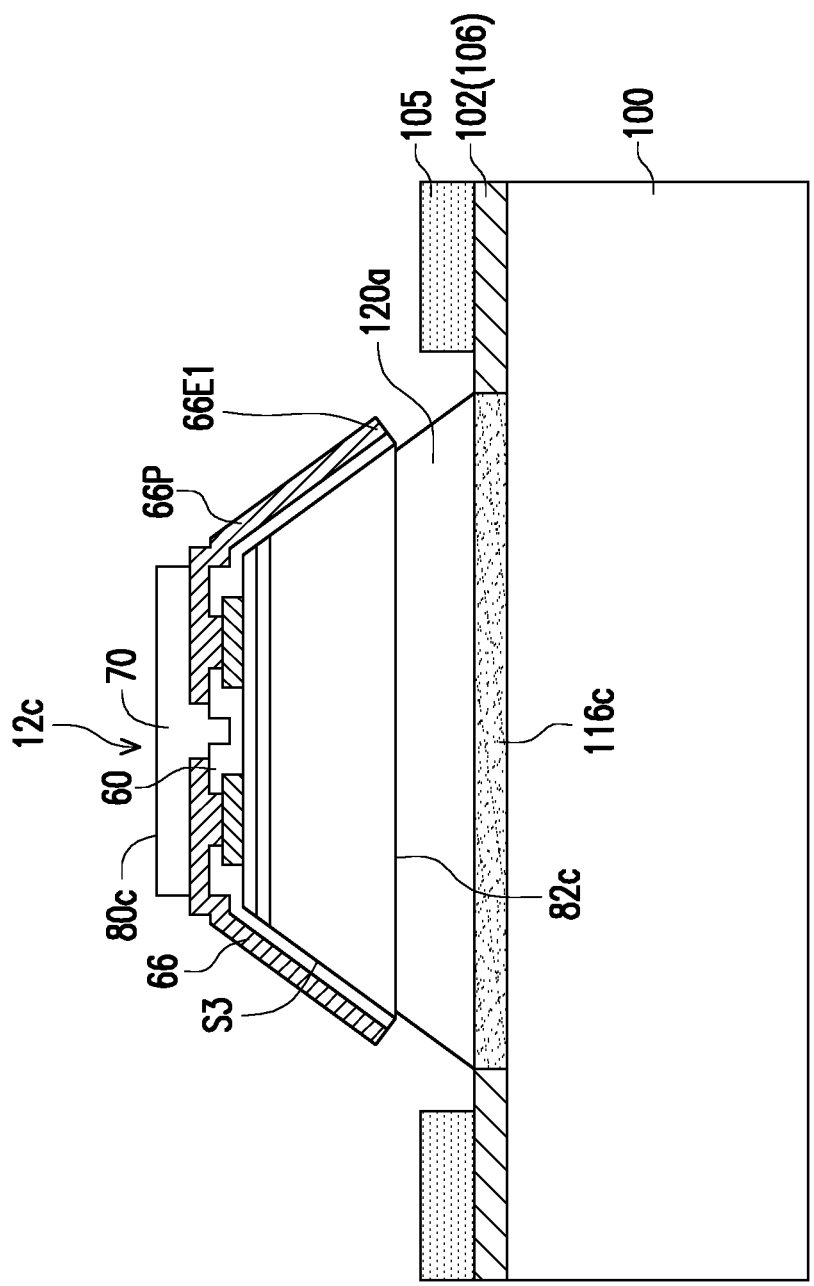

Referring to FIG. 9C, the third dies 12c are attached on the adhesive layer 116c of the substrate 100. If an offset occurs during attaching, the third dies 12c are offset to the droplet 120a on the second redistribution layer 102. With time delay, the third dies 12c may still be self-aligned with the adhesive layer 116c between the second redistribution layer 102 and moved between the second redistribution layer 102 as shown in FIG. 9D. The reasons are that the adhesive layer 116c and the second redistribution layer 102 have different surface tensions, and with time delay, the portion of the droplet 120a covering the second redistribution layer 102 tends to gather with another portion of the droplet 120a located between the second redistribution layer 102. Therefore, the third dies 12c may be self-aligned on the adhesive layer 116c assembled between the second redistribution layer 102. Thereafter, a heating process may be performed to remove the droplet 120a such that the third dies 12c are brought in contact with the adhesive layer 116c and attached on the substrate 100.

Figure 8C:
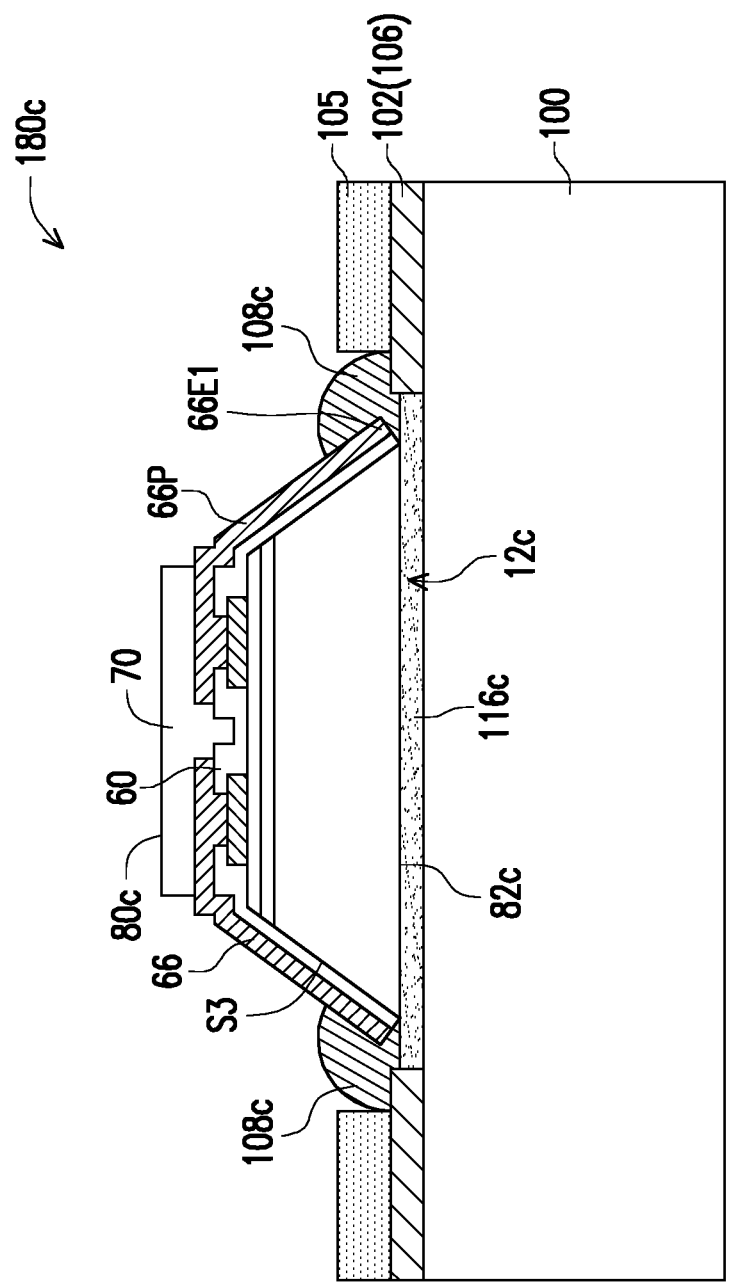
Figure 8D:
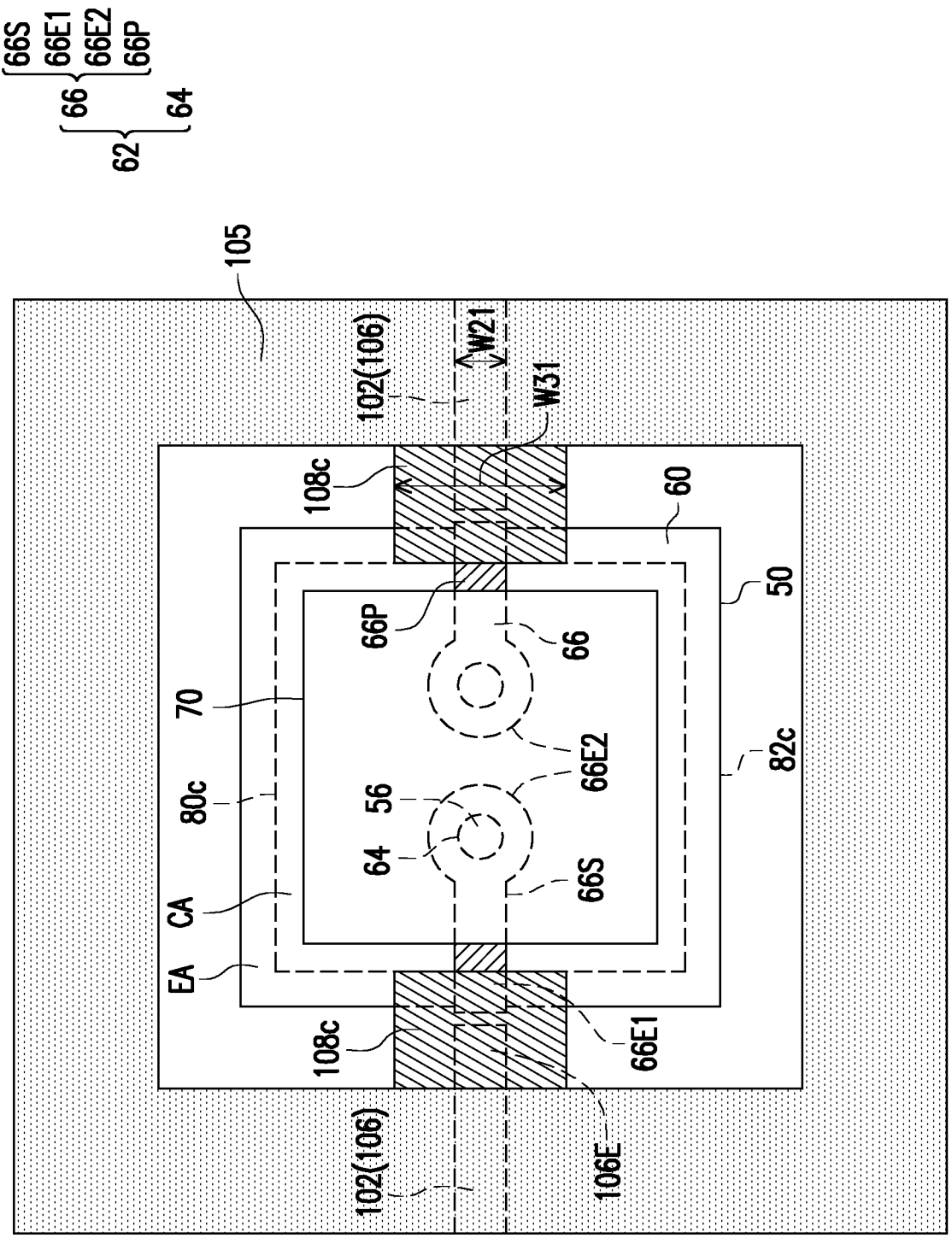
FIG. 8D is a top view of FIG. 8C.

Referring to FIGS. 8C and 8D, after the third dies 12c are attached on the substrate 100, connecting portions 108c are formed on the surface and the sidewalls of the ends 66E1 of the traces 66 and on the surface and the sidewalls of the ends 106E of the traces 106 to connect the first redistribution layer 62 and the second redistribution layer 102. In some embodiments, the connecting portions 108c also cover the portions 66P of the traces 66 on the sidewalls S3 of the third dies 12c. The method of forming the connecting portions 108c and the contour thereof are similar to the method of forming the connecting portions 108a and the contour thereof and are not repeated herein.

At this point, a hetero-integrated structure 180c is formed. Next, a dicing process may be further performed.

Fourth Embodiment

In the third embodiment, the non-active surface 82a of the third dies 12c faces the substrate 100 during attaching. Referring to FIG. 10A and FIG. 10B, in the present embodiment, the plurality of third dies 12c are attached on the substrate 100 in a pick and place manner. However, during attaching, the active surface 80c of the third dies 12c faces the substrate 100, and the protective layers 70 of the third dies 12c are brought in contact with an adhesive layer 116d. The portions 66P of the traces 66 on the sidewalls S3 of the third dies 12c are aligned with the traces 106 on the substrate 100.

Referring to FIGS. 11A to 11D, similar to the third embodiment, in an embodiment, the adhesive layer 116d may be a hydrophilic solid, colloid, or a liquid before attaching; and the second redistribution layer 102 is a solid and hydrophobic. A hydrophilic droplet 120b is coated on the adhesive layer 116d, and even if offset occurs during the attaching of the third dies 12c, via the characteristics of different surface tensions, the third dies 12c are moved via the droplet 120b and self-aligned with the adhesive layer 116d assembled between the second redistribution layer 102. Next, a vaporization process may be performed to remove the droplet 120b such that the third dies 12c are brought in contact with the adhesive layer 116d and attached on the substrate 100.

Figure 11A:
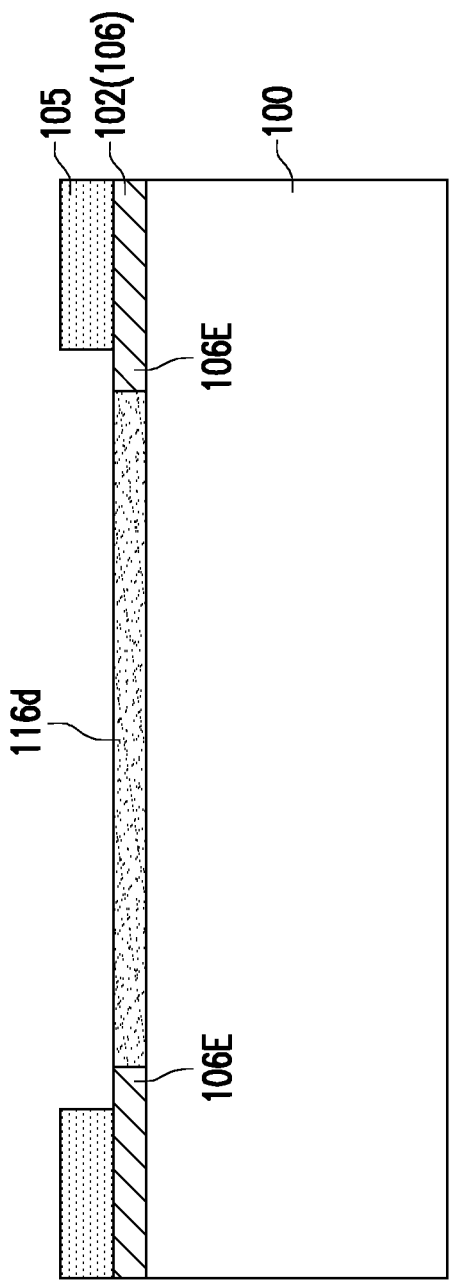
FIGS. 11A to 11D are schematic cross-sectional views of a fabrication process of a hetero-integrated structure according to an embodiment of the disclosure.
Figure 11B:
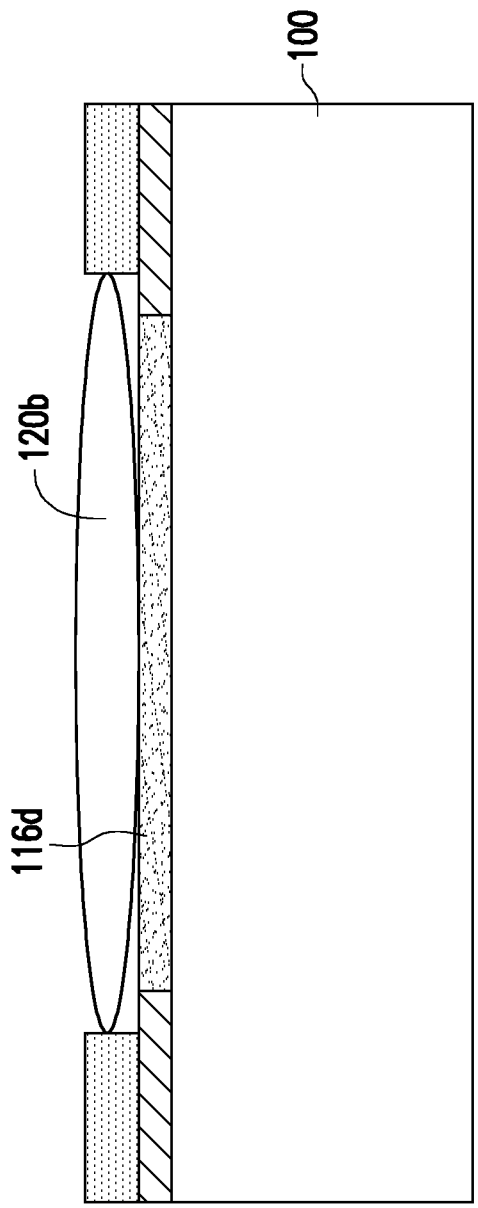
Figure 11C:
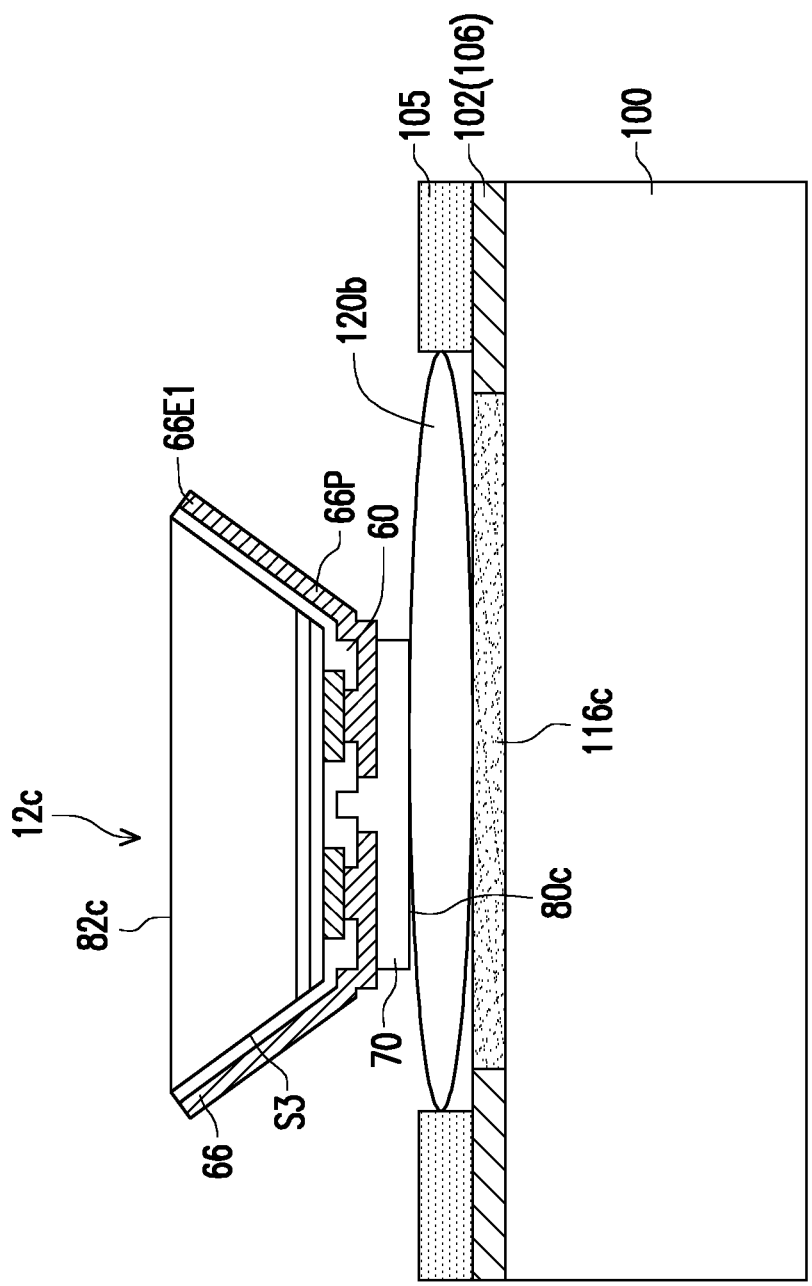
Figure 11D:
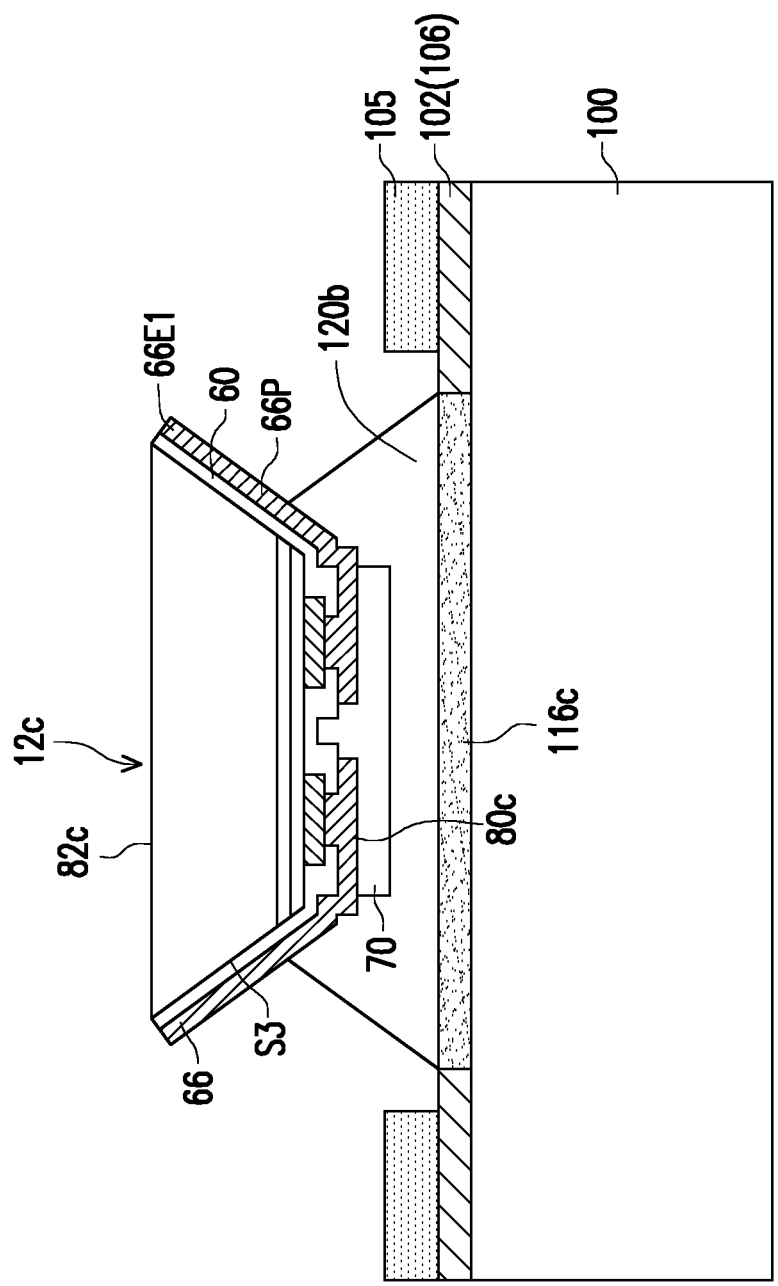

In addition, in some embodiments, in order to improve the adhesion between the third dies 12c and the adhesive layer 116d, a surface treatment may be performed on the first redistribution layer 62 and the passivation layer 60 on the sidewalls S3 of the third dies 12c to increase the surface tension thereof, such that the droplet 120b is in contact with the active surface 80a of the third dies 12c, and in contact with the first redistribution layer 62 and the passivation layer 60 on the sidewalls S3 of the third dies 12c, as shown in FIG. 11D. The surface treatment is, for example, plasma cleaning or UV irradiation cleaning.

Figure 10C:
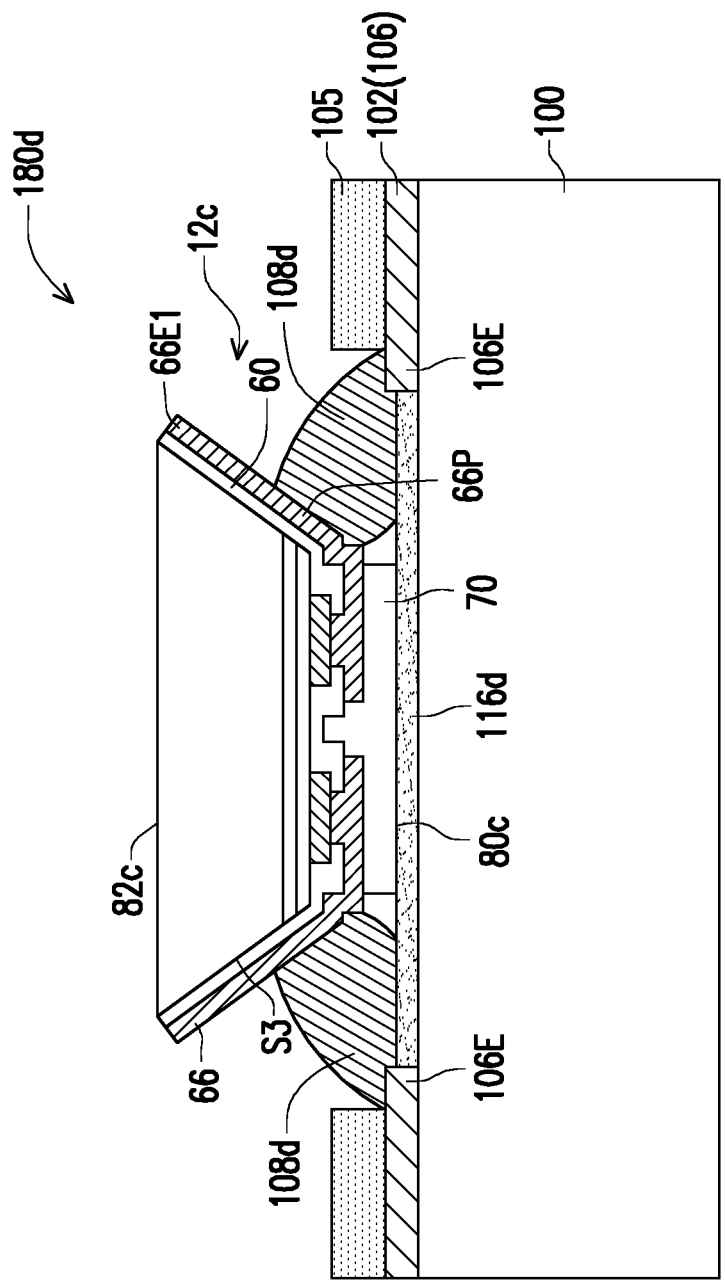
Figure 10D:
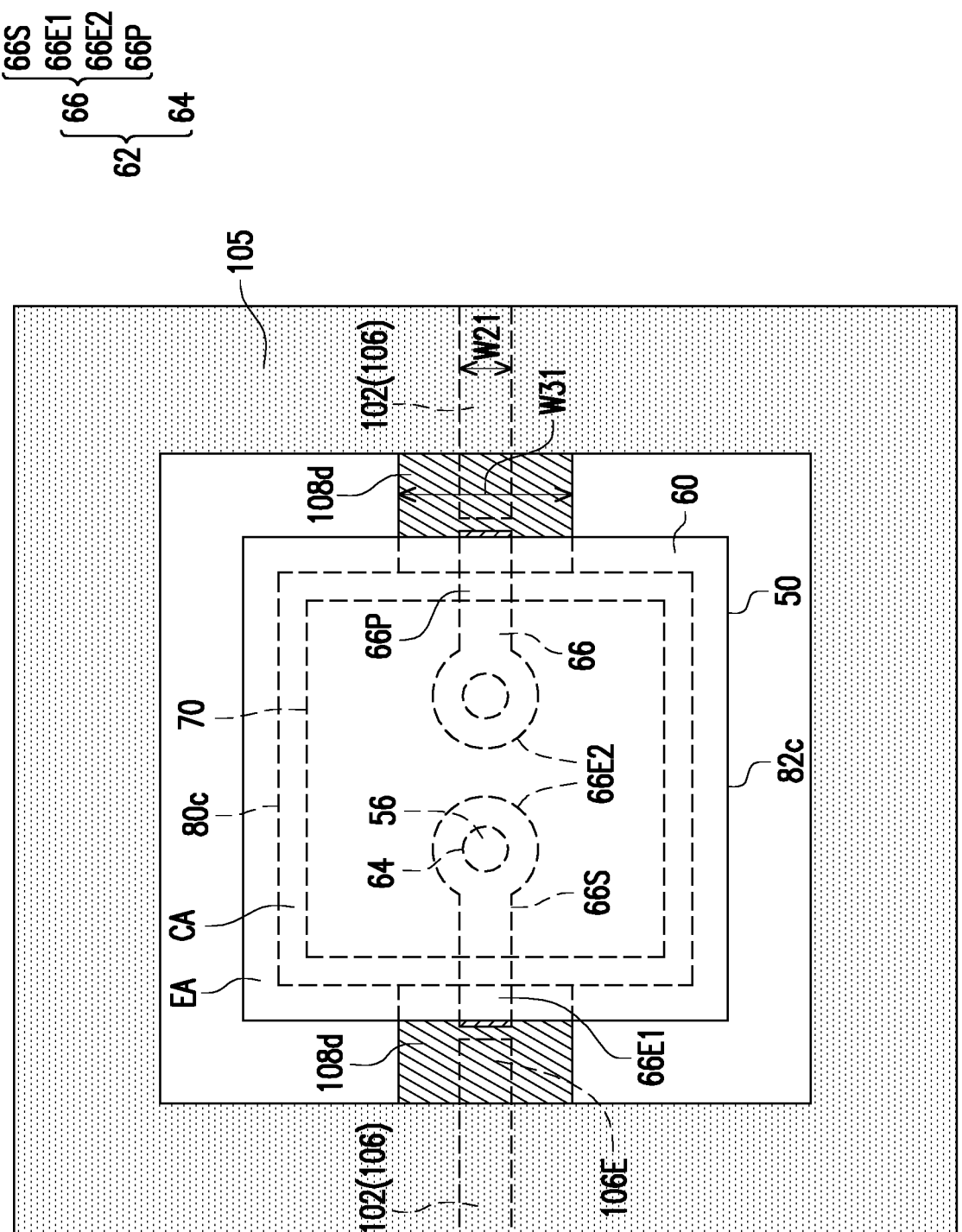
FIG. 10D is a top view of FIG. 10C.

Next, referring to FIGS. 10C and 10D, after the third dies 12c are attached on the substrate 100, connecting portions 108d are formed on the surface and the sidewalls of the portions 66P of the traces 66 and on the surface and the sidewalls of the ends 106E of the traces 106 to connect the first redistribution layer 62 and the second redistribution layer 102. In some embodiments, the connecting portions 108d are extended to the edge of the protective layers 70, and are even in contact with the protective layers 70.

At this point, a hetero-integrated structure 180d is formed. Next, a dicing process may be further performed.

The fourth dies 12d and the fifth dies 12e may be attached on a substrate having cavities by an adhesive layer as described in the second embodiment.

Based on the above, the disclosure may achieve low-temperature bonding in an atmospheric environment via an ultra-low temperature process such as electroplating or electroless plating. Furthermore, in the disclosure, a wafer-level or panel-level process is adopted for attaching a plurality of dies. In addition, the use of an adhesive layer in liquid state or a droplet may achieve the effect of self-aligned assembly during attaching.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A hetero-integrated structure, comprising:
   a substrate;
   a die attached on the substrate, wherein the die has an active surface and a non-active surface, and the active surface has pads;
   a passivation layer covering sidewalls and a surface of the die to expose a surface of the pads;
   a first redistribution layer located on the passivation layer and electrically connected to the pads;

a second redistribution layer located on the substrate and adjacent to the die; and connecting portions connected to the first redistribution layer and the second redistribution layer, wherein a width of the connecting portions is greater than a width of the first redistribution layer and greater than a width of the second redistribution layer.

2. The hetero-integrated structure of claim 1, further comprising an adhesive layer located between the die and the substrate.

3. The hetero-integrated structure of claim 2, wherein the non-active surface of the die is in contact with the adhesive layer.

4. The hetero-integrated structure of claim 2, wherein the sidewalls of the die are in contact with the adhesive layer.

5. The hetero-integrated structure of claim 3, wherein the active surface of the die is closer to the adhesive layer than the non-active surface thereof.

6. The hetero-integrated structure of claim 2, wherein the adhesive layer is hydrophilic.

7. The hetero-integrated structure of claim 1, wherein the substrate has a cavity, and the die is attached in the cavity.

8. The hetero-integrated structure of claim 7, wherein an area of the active surface of the die is greater than or equal to an area of the non-active surface thereof.

9. The hetero-integrated structure of claim 1, wherein an area of the active surface of the die is less than an area of the non-active surface thereof.

10. The hetero-integrated structure of claim 1, wherein the die has vertical sidewalls, inclined sidewalls, stepped sidewalls, curved sidewalls, or a combination thereof.

11. A method of fabricating a hetero-integrated structure, comprising:

providing a wafer, wherein the wafer comprises a plurality of dies, each of the dies has an active surface and a non-active surface, and the active surface has pads;

forming recesses between the dies, wherein the recesses expose first sidewalls of the dies;

forming a passivation layer on the wafer to cover a surface of the dies to expose a surface of the pads;

forming a first redistribution layer on the passivation layer, wherein the first redistribution layer is electrically connected to the pads;

performing a dicing process to separate the dies on the wafer from each other;

attaching the dies on a substrate, wherein the substrate has a second redistribution layer thereon; and forming connecting portions connected to the first redistribution layer and the second redistribution layer, wherein a width of the connecting portions is greater than a width of the first redistribution layer and greater than a width of the second redistribution layer.

12. The method of fabricating the hetero-integrated structure of claim 11, wherein a method of forming the connecting portions comprises:

forming a first protective layer on the passivation layer and the first redistribution layer to expose a first end of the first redistribution layer;

forming a second protective layer on the substrate and the second redistribution layer to expose a second end of the second redistribution layer; and forming the connecting portions via electroplating or electroless plating.

13. The method of fabricating the hetero-integrated structure of claim 11, wherein the forming of the plurality of recesses between the dies comprises:

performing a wafer pre-cutting process from the active surface of the dies toward the non-active surface thereof or performing a lithography and etching process before the passivation layer is formed on the wafer, wherein the passivation layer further covers the first sidewalls of the dies.

14. The method of fabricating the hetero-integrated structure of claim 13, wherein the forming of the plurality of recesses between the dies comprises:

performing the wafer pre-cutting process from the non-active surface of the dies toward the active surface thereof after the passivation layer is formed on the wafer.

15. The method of fabricating the hetero-integrated structure of claim 11, wherein the dies are attached on the substrate via an adhesive layer formed on the substrate.

16. The method of fabricating the hetero-integrated structure of claim 15, wherein the dies are attached on the substrate via the adhesive layer formed on the substrate and a droplet on the adhesive layer.

17. The method of fabricating the hetero-integrated structure of claim 15, wherein the active surface of the dies is closer to the adhesive layer than the non-active surface thereof.

18. The method of fabricating the hetero-integrated structure of claim 15, wherein the non-active surface of the dies is closer to the adhesive layer than the active surface thereof.

19. The method of fabricating the hetero-integrated structure of claim 15, wherein the substrate comprises cavities, the dies are attached in the cavities of the substrate, and the adhesive layer is located in the cavities.

* * * * *